United States Patent
Maeda et al.

(10) Patent No.: US 6,355,957 B1
(45) Date of Patent: Mar. 12, 2002

(54) SEMICONDUCTOR DEVICE HAVING BODY POTENTIAL FIXING PORTION AND CLOSED-LOOP GATE STRUCTURE

(75) Inventors: Shigenobu Maeda; Kazuya Yamamoto; Hiroshi Komurasaki, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/610,426

(22) Filed: Jul. 5, 2000

(30) Foreign Application Priority Data

Jan. 5, 2000 (JP) .......................................... 12-005242

(51) Int. Cl.$^7$ ............................................. H01L 27/01
(52) U.S. Cl. ...................................... 257/347; 257/355
(58) Field of Search ................................ 257/202–211; 6/347–355; 438/152–154

(56) References Cited

U.S. PATENT DOCUMENTS

| 5,670,396 A | 9/1997 | Shibib ........................... 437/32 |
| 5,767,547 A | 7/1998 | Merchant et al. ............ 257/347 |
| 6,225,665 B1 * | 5/2001 | Hirano ......................... 257/347 |

FOREIGN PATENT DOCUMENTS

| EP | 0 676 799 | 10/1995 |
| JP | 10-214971 | 8/1998 |

OTHER PUBLICATIONS

Patent Abstracts of Japan, vol. 1998, No. 13, Nov. 30, 1998, JP 10 214971, Aug. 11, 1998.
K.K. Young, et al., "Avalanche–Induced Drain–Source Breakdown in Silicon–on–Insulator n–MOSFET's," IEEE Transactions On Electron Devices, vol. 35, No. 4, (Apr. 1988), pp. 426–431.

Y.–C. Tseng, et al. "Correlation Between Low–Frequency Noise Overshoot in SOI MOSFETSs and Frequency Dependence of Floating Body Effect," 1997 Symposium on VLSI Technology Digest of Technical Papers, (Jan. 1997), pp. 99–100.

H. Shimomura, et al., "A Mesh–Arrayed MOSFET (MA–MOS) for High–Frequency Analog Applications," 1997 Symposium on VLSI Tecnology Digest of Technical Papers, (Jan. 1997), pp. 73–74.

* cited by examiner

Primary Examiner—David Nelms
Assistant Examiner—Tutu Ho
(74) Attorney, Agent, or Firm—Oblon, Spivak, McClelland, Maier & Neustadt, P.C.

(57) ABSTRACT

An object is to obtain a semiconductor in which the body potential can be externally fixed with a body potential fixing portion and in which no semiconductor region where ions of different conductivity types are mixed exists. A semiconductor layer (10) on an insulating layer (20) has an under semiconductor layer (10*b*) under an element isolation portion (14) and a body (10*a*) under a closed-loop portion (150). A gate structure (15) has gate pads (151) and the closed-loop portion (150). While a body potential fixing portion (13) is located on the opposite side of the element isolation portion (14) from the gate structure (15), the gate structure (15) is formed from the semiconductor layer (10) to extend on the element isolation portion (14). Accordingly, the body potential fixing portion (13) can be connected to the body (10*a*) through the under semiconductor layer (10*b*) without through the pn junction formed by the source (12) and the semiconductor layer (10).

19 Claims, 38 Drawing Sheets

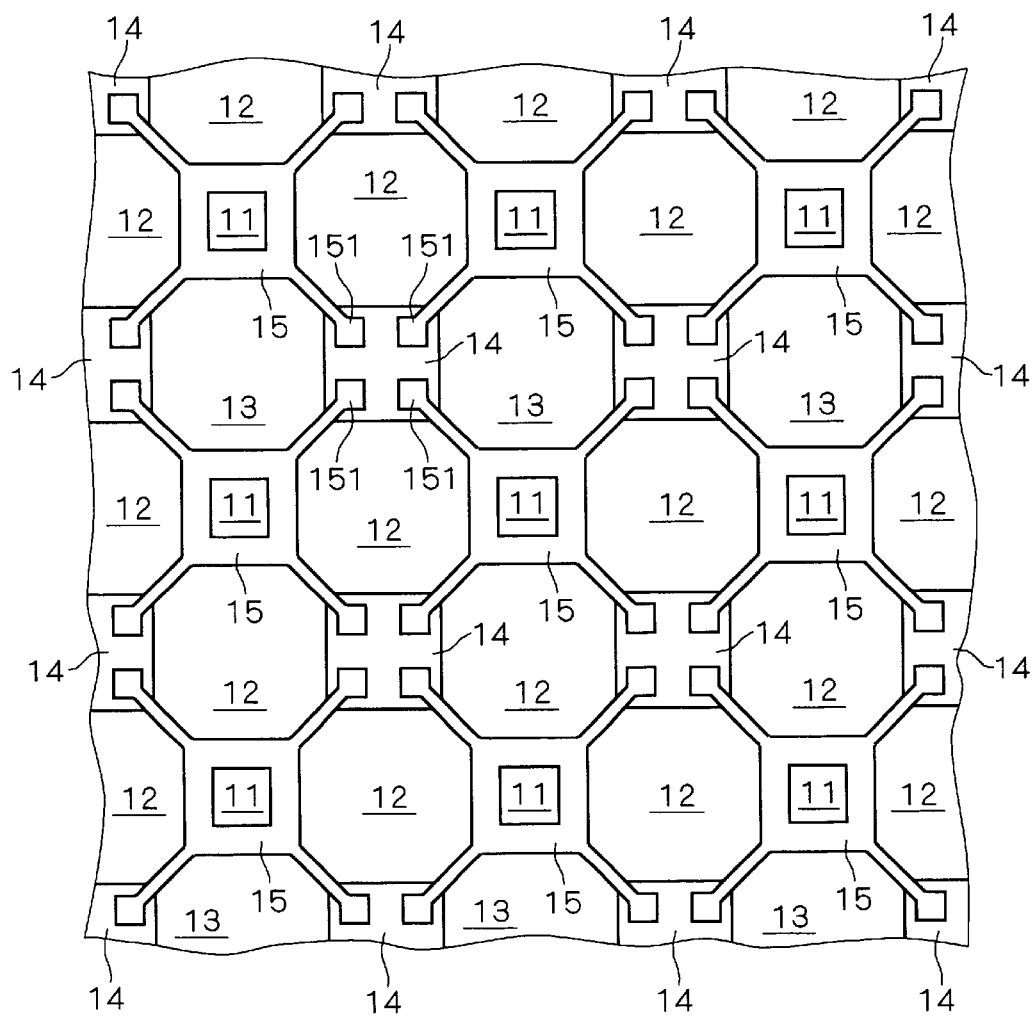
F I G. 17

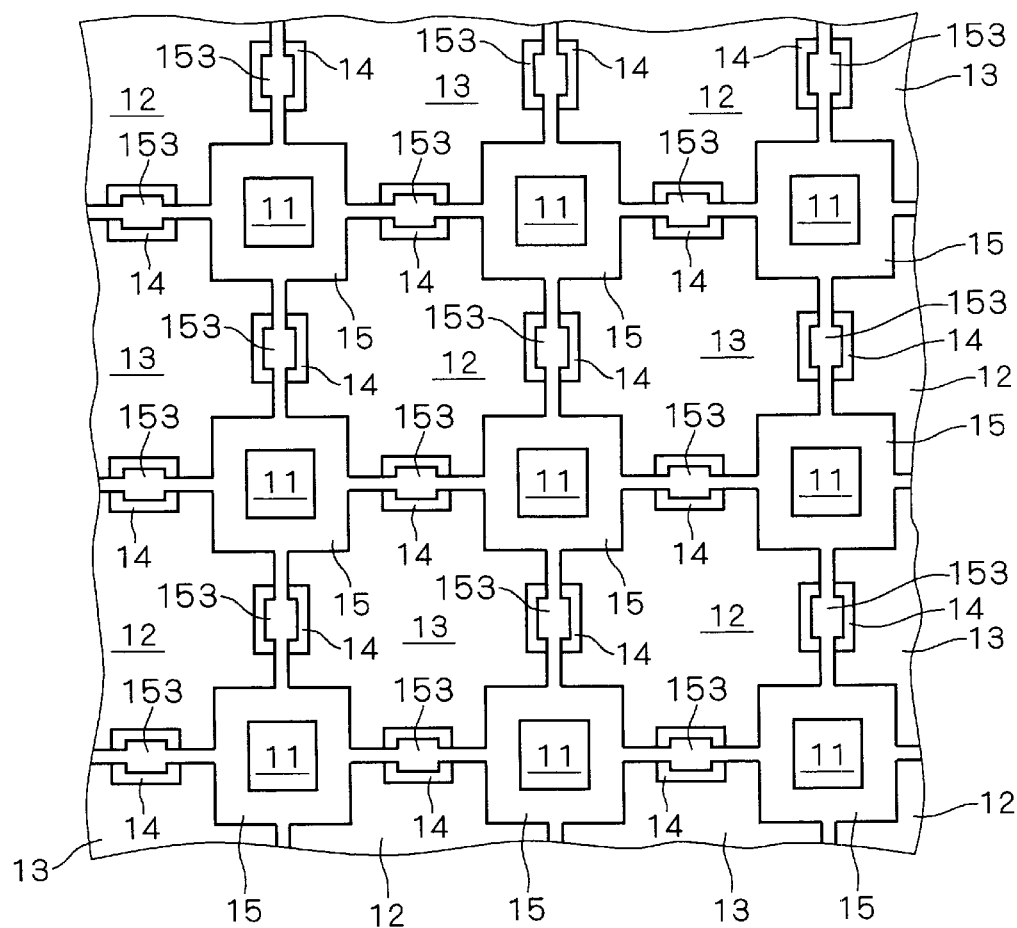
F I G . 22

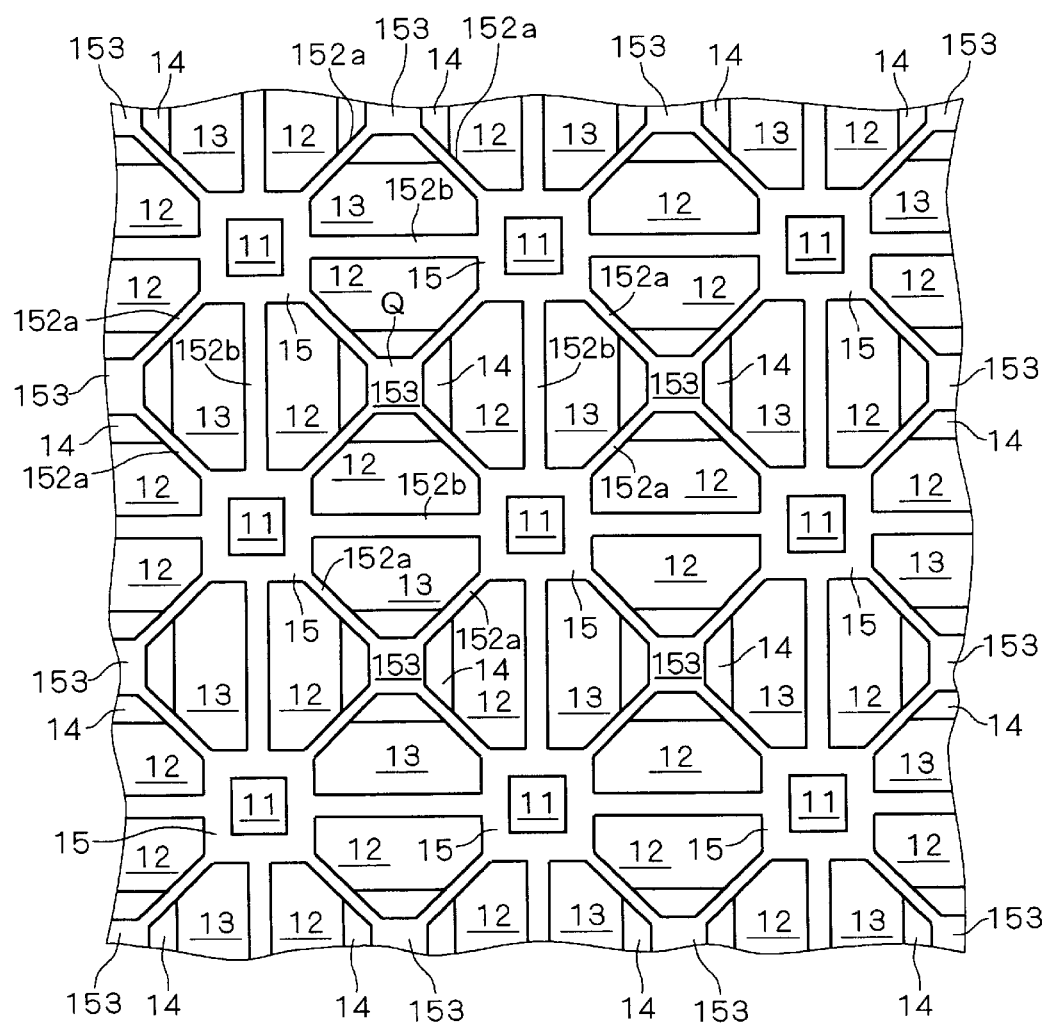
F I G . 32

SEMICONDUCTOR DEVICE HAVING BODY POTENTIAL FIXING PORTION AND CLOSED-LOOP GATE STRUCTURE

BACKGROUND OF THE INVENTION

1. Field of the Invention

The present invention relates to SOI (Semiconductor On Insulator) structure MIS (Metal Insulator Semiconductor) type FET (Field Effect Transistor, hereinafter such a transistor is referred to as SOIMISFET). The invention relates particularly to a technique of fixing the body potential of the SOIMISFET.

2. Description of the Background Art

FIG. 41 is a sectional view showing the structure of a conventional SOIMISFET. An insulator 82 is formed on the entire surface of a substrate 81 and a semiconductor layer 90 is formed thereon. Note that the semiconductor layer 90 is sectioned by an element isolation portion 94 which is insulating and in contact with the insulator 82.

A gate insulating film 95d is selectively formed on the upper surface of the semiconductor layer 90, or on its main surface away from the contact with the insulator 82, and a gate electrode 95e is formed on the gate insulating film 95d; the gate electrode 95e faces the upper surface of the semiconductor layer 90 through the gate insulating film 95d. The gate insulating film 95d and the gate electrode 95e form a gate structure 95.

A pair of impurity regions, or a drain 91 and a source 92, are formed to the upper surface of the semiconductor layer 90 from its lower surface or main surface in contact with the insulator 82. The drain 91 and the source 92 somewhat penetrate under the ends of the gate insulating film 95d and face each other through the body 90a, i.e. the semiconductor layer 90 under the gate insulating film 95d. For example, with an n-type SOIMISFET, the drain 91 and the source 92 are set to n⁺ type and the body 90a is set to p⁻ type.

The conventional SOIMISFET had the problem that the body 90a is in a floating state, which causes parasitic bipolar phenomenon and reduces the breakdown voltage between the source 92 and the drain 91. This problem is described on and after page 426 in IEEE Trans. on Electron Devices Vol. 35, no. 4, April 1988 by K. K. Young, et al., for example.

This problem will now be briefly described with an n-type SOIMISFET. A passage of current between the source 92 and the drain 91 causes impact ionization in the drain 91. Then holes take place and are accumulated in the body 90a in a floating state, which increases the potential at the body 90a. The potential rise in the body 90a turns on the npn-type parasitic bipolar transistor formed by the source 92, body 90a and drain 91, which causes feedback in which the current flowing between the source 92 and drain 91 increases. This deteriorates the breakdown voltage between the source 92 and drain 91.

Furthermore, the floating-state body 90a also causes so-called 1/f noise due to the potential instability. This problem is described on and after page 99 in Y.-C. Tseng, et al. 1997 Symp. On VLSI Tech. Digest of Technical Paper, for example. The structure shown in FIG. 41 has been regarded as unsuited for high-frequency analog devices because of the presence of the noise.

Meanwhile, SOIMISFETs having body potential drawing portions and ring-like gate structures have been suggested to avoid the floating state of the body 90a so as to improve the high-frequency characteristics, an example of which is shown in Japanese Patent Laying-Open No. 10-214971.

FIG. 42 is a plan showing the structure of an SOIMISFET having a ring-like gate structure; the section seen from the direction indicated by the arrows MM in the diagram corresponds to the sectional view of FIG. 41.

In the plane view, the gate structure 95 has an octagonal closed-loop portion and a pair of extensions 96 each coupled to the closed-loop portion and to contact pad 97. The drain 91 is surrounded by the closed-loop portion. Two pairs of sources 92 are provided outside the closed-loop portion; the sources 92 in each pair adjoin with an extension 96 therebetween. Body potential drawing portions 93 are each interposed between two sources 92 belonging to different pairs. The body potential fixing portions 93 are set to a different conductivity type from the drain 91 and the sources 92; for example, they are set to p⁺-type in an n-type SOIMISFET.

The sources 92 and the body potential fixing portions 93 are surrounded by the element isolation portion 94. The gate contact pads 97, the drain 91, the sources 92, and the body potential fixing portions 93 have contacts 97c, 91c, 92c and 93c, respectively.

In the structure shown in FIG. 42, formation of the sources 92 and the body potential fixing portions 93 of different conductivity types requires ion implantation to be separately applied inside and outside the boundaries shown by the broken line. However, in practice, ions of different conductivity types do not always exclusively exist in the vicinity of the boundaries. When silicon is adopted as the semiconductor, cobalt silicide etc. is often formed on the boundaries between the sources 92 and the body potential fixing portions 93. However, it is not easy to favorably perform the silicidation in areas where ions of different conductivity types are mixed. Even if the growth can be achieved, it may peel off.

Further, in the structure shown in FIG. 42, it is not desirable to apply the so-called partial trench isolation. FIG. 44 is a sectional view showing a problem encountered when the partial trench isolation is applied to the structure shown in FIG. 42. This diagram shows an example in which the gate structure 95 has sidewalls. In the partial trench isolation, isolation oxide films 98 are provided on the upper surface of the semiconductor layer 90 without making contact with the insulator 82. The body 90a is connected to the semiconductor layer 90b under the isolation oxide film 98 on the right in the drawing through the source 92, and is further connected to the body potential fixing portion 93 through the semiconductor layer 90b.

This structure allows the ion implantation to be separately performed on the two sides of the isolation oxide film 98 to form the source 92 and the body potential fixing portion 93 of different conductivity types, and then it is possible to avoid formation of semiconductor region in which ions of different conductivity types are mixed. However, the source 92 form the pn junction J1 with the body 90a and the pn junction J2 with the semiconductor layer 90b. Since the pn junctions J1 and J2 are series-connected with opposite polarities in the path from the body 90a to the body potential fixing portion 93, it is difficult to externally fix the potential in the body 90a via the body potential fixing portion 93.

Referring to FIG. 42 again, the structure can provide more favorable high-frequency characteristics as the extensions 96 are formed shorter. FIG. 43 is a circuit diagram showing an example of an equivalent circuit of the SOIMISFET. When this circuit is adopted, the maximum oscillation frequency $f_{max}$ of the transistor can be given with the cur-off frequency $f_T$ as follows.

$$f_{max} = \frac{f_T}{2\sqrt{R_g(g_{ds} + 2\pi f_T C_{gd}) + g_{ds}(R_i + R_s)}} \quad \text{Eq. 1}$$

$$f_T = \frac{g_m}{2\pi (C_{gs} + C_{gd})}$$

Where $R_i$, $R_g$, $R_s$, $R_d$ and $R_{ds}$, are body resistance, gate resistance, source resistance, drain resistance and drain-source resistance, $C_{gs}$, $C_{ds}$, and $C_{gd}$ are gate-source capacitance, drain-source capacitance and gate-drain capacitance, and $g_m$ and $g_{ds}$ are transconductance and drain conductance, respectively.

The minimum noise figure $F_{min}$ can be given as follows.

$$F_{min} = 1 + 2\pi f K C_{gs} \sqrt{\frac{R_g + R_s}{g_m}} \quad \text{Eq. 2}$$

$$k \approx 2.5$$

As can be seen from the two equations above, decreasing the gate resistance $R_g$ improves the maximum oscillation frequency $f_{max}$ and the minimum noise figure $F_{min}$.

SUMMARY OF THE INVENTION

According to a first aspect of the present invention, a semiconductor device comprises: an insulating layer having a main surface extending in a first direction and a second direction which intersect with each other; a semiconductor layer having a first conductivity type and having a first main surface and a second main surface which is in contact with the main surface of the insulating layer; at least one element isolation portion which is insulative and formed on the first main surface apart from the second main surface; at least one body potential fixing portion having the first conductivity type, formed at least on the first main surface of the semiconductor layer, and in contact with a first under semiconductor layer which is the semiconductor layer existing between the element isolation portion and the second main surface; at least one gate structure in which a gate insulating film is formed on the first main surface and a gate electrode is formed over the first main surface with the gate insulating film interposed therebetween, the at least one gate structure comprising a closed-loop portion which crosses a boundary between the element isolation portion and the first main surface and forms a closed loop on the element isolation portion and the first main surface, the closed loop being kept away from the body potential fixing portion; at least one first impurity region having a second conductivity type which is opposite to the first conductivity type, formed from the first main surface to the second main surface, and surrounded by the first under semiconductor layer and a second under semiconductor layer which is the semiconductor layer existing between the gate structure and the second main surface; and at least one second impurity region having the second conductivity type, facing to the first impurity region through the second under semiconductor layer, and separated from the body potential fixing portion by the first under semiconductor layer.

Preferably, according to a second aspect of the invention, in the semiconductor device, the first and second impurity regions are a drain and a source, respectively.

Preferably, according to a third aspect of the invention, in the semiconductor device, a plurality of first impurity regions and/or a plurality of second impurity regions are provided, and the first impurity region and the second impurity region are alternately arranged around one element isolation portion.

Preferably, according to a fourth aspect of the invention, in the semiconductor device, a plurality of element isolation portions are provided, one gate structure is provided over the plurality of element isolation portions, and the gate structure has gate contact pads on the element isolation portions.

Preferably, according to a fifth aspect of the invention, in the semiconductor device, a plurality of body potential fixing portions are provided, one body potential fixing portion is surrounded by one element isolation portion, and the element isolation portions are arranged checkerwise and the one gate structure has the gate contact pads on two of the element isolation portions.

Preferably, according to a sixth aspect of the invention, in the semiconductor device, a plurality of gate structures are provided, and the element isolation portions are arranged in a matrix and the one gate structure has the gate contact pads on four of the element isolation portions.

Preferably, according to a seventh aspect of the invention, in the semiconductor device, the body potential fixing portion is adjacent also to the second under semiconductor layer.

According to an eighth aspect of the invention, a semiconductor device comprises: an insulating layer having a main surface extending in a first direction and a second direction which intersect with each other; a semiconductor layer having a first conductivity type and having a first main surface and a second main surface which is in contact with the main surface of the insulating layer; at least one gate structure in which a gate insulating film is formed on the first main surface and a gate electrode is formed over the first main surface with the gate insulating film interposed therebetween, the at least one gate structure comprising a closed-loop portion forming a single closed loop and at least one extension having its one end coupled to the closed-loop portion; at least one first impurity region and at least one second impurity region both having a second conductivity type opposite to the first conductivity type and formed from the first main surface to the second main surface of the semiconductor layer, the first impurity region and the second impurity region being separated from each other by an under semiconductor layer which is the semiconductor layer existing between the closed-loop portion of the gate structure and the second main surface; and at least one body potential fixing portion having the first conductivity type and formed at least on the first main surface, the body potential fixing portion being separated from one first impurity region by the under semiconductor layer and being separated from the second impurity region by an under region located between the extension of the gate structure and the second main surface.

Preferably, according to a ninth aspect of the invention, in the semiconductor device, the first and second impurity regions are a drain and a source, respectively.

Preferably, according to a tenth aspect of the invention, in the semiconductor device, a plurality of gate structures are provided, and at least one second impurity region is interposed between a pair of body potential fixing portions.

Preferably, according to an eleventh aspect of the invention, in the semiconductor device, a plurality of gate structures are provided, and in each gate structure, the at least one extension has a contact pad at its other end, and the semiconductor device further comprises at least one element isolation portion which is insulative and provided on the first main surface and at least one of the contact pad of different ones of the gate structures are provided on the element isolation portion.

Preferably, according to a twelfth aspect of the invention, in the semiconductor device, the extensions are also provided on the element isolation portion.

Preferably, according to a thirteenth aspect of the invention, in the semiconductor device, one gate contact pad is provided on one element isolation portion and shared by different ones of the gate structures.

Preferably, according to a fourteenth aspect of the invention, in the semiconductor device, the closed-loop portions are provided in a matrix, a plurality of element isolation portions are provided, one gate structure comprises a plurality of extensions, and one element isolation portion is surrounded by a quadrilateral formed by two pairs of the gate structures, and wherein, among the extensions of the two pairs of closed-loop portions, the extensions which extend to one element isolation portion are coupled with each other at the gate contact pad, and four of the extensions of the two pairs of the closed-loop portions form the sides of the quadrilateral.

Preferably, according to a fifteenth aspect of the invention, in the semiconductor device, a plurality of second impurity regions and a plurality of body potential fixing portions are provided for one gate structure, and the second impurity regions and the body potential fixing portions are alternately arranged around one first impurity region, with a plurality of extensions interposed therebetween.

Preferably, according to a sixteenth aspect of the invention, in the semiconductor device, a plurality of second impurity regions and a plurality of body potential fixing portions are provided for one gate structure, the second impurity regions and the body potential fixing portions are arranged around one first impurity region with a plurality of the extensions interposed therebetween, and the gate contact pad which is coupled with one of the extensions interposed between a pair of the second impurity regions or a pair of the body potential fixing portions is respectively surrounded by the second impurity regions or the body potential fixing portions.

Preferably, according to a seventeenth aspect of the invention, in the semiconductor device, a boundary between the second impurity region and the closed-loop portion is longer than a boundary between the body potential fixing portion and the closed-loop portion.

Preferably, according to an eighteenth aspect of the invention, in the semiconductor device, a boundary between the body potential fixing portion and the closed-loop portion is longer than a boundary between the second impurity region and the closed-loop portion.

Preferably, according to a nineteenth aspect of the invention, in the semiconductor device, the closed-loop portion has a larger width in a position interposed between the body potential fixing portion and the first impurity region than in a position interposed between the first impurity region and the second impurity region.

According to the semiconductor device of the first aspect of the invention, the gate structure crosses a boundary between the element isolation portion and the first main surface, so that the second under semiconductor layer can be connected to the body potential fixing portion through the first under semiconductor layer. Hence, the part of the second under semiconductor layer which is interposed between the first impurity region and the second impurity region and functions as the body can be fixed at a given potential without through the pn junctions which the second under semiconductor layer forms with the first and second impurity regions.

According to the semiconductor device of the second aspect of the invention, the second impurity region formed outside of the closed-loop portion can be formed larger than the first impurity region formed inside the closed-loop portion. Then the drain current can be expanded and a larger number of source contacts can be formed, which reduces the source resistance and improves the frequency characteristic and noise characteristic.

According to the semiconductor device of the third aspect of the invention, a plurality of transistors are formed around the element isolation portion. Furthermore, the transistors can share the body potential fixing portion in common, so that the layout area can be reduced. This also enables easy layout.

According to the semiconductor device of the fourth aspect of the invention, the interval between the gate contact pads and the semiconductor layer can be made larger, which reduces the parasitic capacitance. Furthermore, since the gate structure extends over the boundaries between the element isolation portions and the first main surface, the distance between the gate contact pads on the element isolation portions and the closed-loop portion can be reduced to reduce the gate resistance. Reducing the parasitic capacitance and the gate resistance improves the high-frequency characteristic.

According to the semiconductor device of the fifth aspect of the invention, adjacent transistors share the first impurity region as drain and the second impurity regions serving as source can be easily formed in larger area.

According to the semiconductor device of the sixth aspect of the invention, an increased number of body potential fixing portions can be connected to the body, which improves the function of fixing the body potential. Further, an increased number of gate contact pads can be provided for one gate structure, which reduces the gate electrode resistance.

According to the semiconductor device of the seventh aspect of the invention, the part of the second under semiconductor layer which is interposed between the first impurity region and the second impurity region and functions as the body can be connected to the body potential fixing portion not only through the first under semiconductor layer but also through the part of the second under semiconductor layer which does not function as the body, which enables the body potential to be more efficiently fixed.

According to the semiconductor device of the eighth aspect of the invention, the under semiconductor layer between the first impurity region and the second impurity region is connected to the body potential fixing portion, so that the under semiconductor layer can be fixed at a given potential. Furthermore, the extension of the gate structure extends between the second impurity region and the body potential fixing portion of different conductivity types, so that the two regions do not directly adjoin. This enables favorable formation of metal compound on the regions.

According to the semiconductor device of the ninth aspect of the invention, the second impurity region formed outside of the closed-loop portion can be formed larger than the first impurity region formed inside the closed-loop portion. Then the drain current can be expanded and a larger number of source contacts can be formed, which reduces the source resistance and improves the frequency characteristic and noise characteristic.

While, in a semiconductor device, the second impurity region as the source and the body potential fixing portion are usually connected in common in use, different amounts of current flow in these regions. According to the semiconductor device of the tenth aspect of the invention, the magnitude of voltage drop tends to be uniform in an array of transistors, which improves the linearity of the characteristics.

According to the semiconductor device of the eleventh aspect of the invention, the interval between the gate contact pads and the semiconductor layer can be enlarged, which reduces the parasitic capacitance.

According to the semiconductor device of the twelfth aspect of the invention, the interval between the extensions and the semiconductor layer can be enlarged to suppress the parasitic capacitance.

According to the semiconductor device of the thirteenth aspect of the invention, the number and area of the gate contact pads can be reduced to reduce the parasitic capacitance of the gate structure, and the area of the element isolation portion can be reduced to enhance the degree of integration of the semiconductor device.

According to the semiconductor device of the fourteenth aspect of the invention, not only the closed-loop portions but also the element isolation portions can be arranged in a matrix, which reduces the area required for the layout.

According to the semiconductor device of the fifteenth aspect of the invention, a plurality of transistors sharing the first impurity region as the drain can be formed to reduce the layout area. Furthermore, the layout is easy and the overall non-uniformity of the amount of current can be suppressed.

According to the semiconductor device of the sixteenth aspect of the invention, even if the second impurity regions as the source and the body potential fixing portions arranged around the first impurity region as the drain display inferior symmetry, the second impurity regions and the body potential fixing portions arranged around the gate contact pad display improved symmetry. This suppresses the overall non-uniformity of the amount of current.

According to the semiconductor device of the seventeenth aspect of the invention, transistors with higher current driving capability can be obtained because the channel width of the transistor can be made larger as the length of the boundary between the second impurity region as the source and the closed-loop portion is made longer.

According to the semiconductor device of the eighteenth aspect of the invention, the body potential can be fixed more certainly because the contact area with the under semiconductor layer as the body can be made larger as the boundary between the body potential fixing portion and the closed-loop portion is made longer.

According to the semiconductor device of the nineteenth aspect of the invention, reducing the width of the closed-loop portion between the second impurity region as the source and the first impurity region as the drain shortens the channel length of the transistor, which provides the transistor with higher current driving capability. On the other hand, enlarging the width of the closed-loop portion between the body potential fixing portion and the first impurity region lengthens the interval between these regions having different conductivity types. This ensures larger margin in the process of separately introducing impurities, which enables favorable formation of metal compound on these regions.

The present invention has been made in consideration of the above-described conditions, and an object of the invention is to provide a technique for obtaining a semiconductor device in which the body potential can be externally fixed with a body potential fixing portion and in which no semiconductor region exists where ions of different conductivity types are mixed.

Another object of the invention is to provide a semiconductor device with reduced gate resistance.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 17 and 18 are plans showing structures according to a fourth modification of the fourth preferred embodiment of the invention.

FIGS. 22 and 23 are plans showing a first modification of the fifth preferred embodiment of the invention.

FIGS. 31 and 32 are plans showing structures according to a modification of the sixth preferred embodiment of the invention.

DESCRIPTION OF THE PREFERRED EMBODIMENTS

Figure 1:
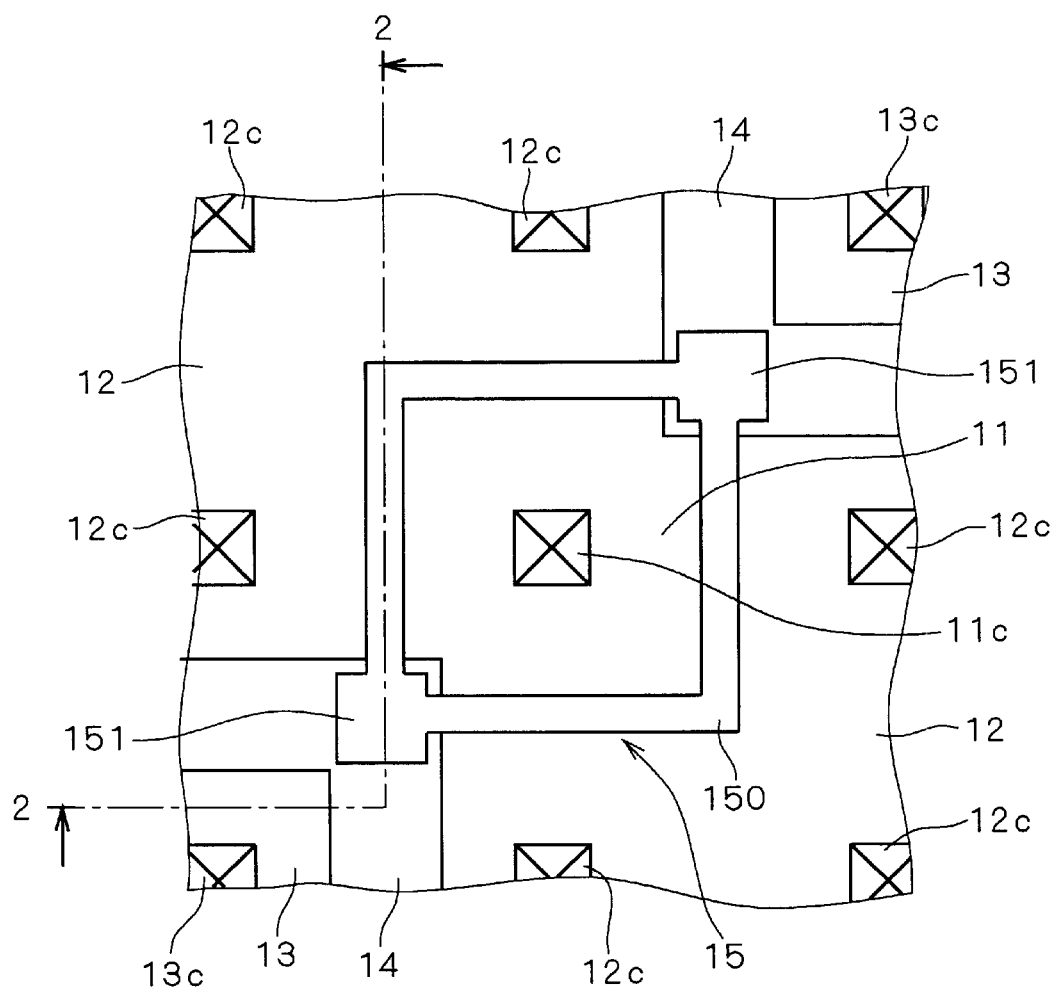
FIG. 1 is a plan showing a structure according to a first preferred embodiment of the invention.
Figure 2:
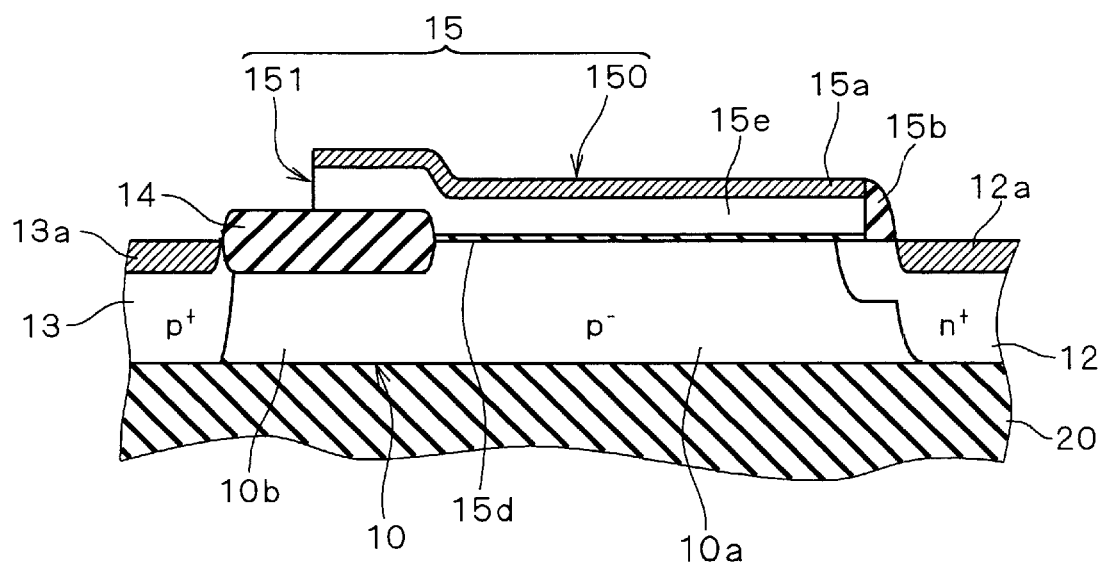
FIG. 2 is a sectional view showing the structure of the first preferred embodiment.

First Preferred Embodiment:

FIG. 1 is a plan showing the structure of an SOIMISFET according to a first preferred embodiment of the invention. FIG. 2 is the sectional view of the structure of FIG. 1 seen from the direction indicated by the arrows 2—2.

A plane is imagined in the top-bottom direction and the right-left direction intersecting with each other on the paper of FIG. 1, with which an insulating layer 20 is provided with its main surface extending in parallel. Provided on the insulating layer 20 is a p⁻-type semiconductor layer 10, which has an upper surface and a lower surface which is in contact with the main surface of the insulating layer 20.

An element isolation portion 14, which is insulating, is formed on the upper surface of the semiconductor layer 10, away from its lower surface, and the semiconductor layer 10 is left as an under semiconductor layer 10b between the element isolation portion 14 and the insulating layer 20. A p⁺-type body potential fixing portion 13 in contact with the under semiconductor layer 10b is formed in the upper surface of the semiconductor layer 10 at least. FIG. 2 shows an example in which the body potential fixing portion 13 reaches the lower source of the semiconductor layer 10. Silicide 13a may be formed on the top of the body potential fixing portion 13. A contact to the body potential fixing portion 13 is shown as the contact 13c. In this preferred embodiment, in the plane view, the body potential fixing portion 13 is separated by the element isolation portion 14 not only from the sources 12 but also from the drain 11.

The gate structure 15 has a stacked-layer structure of a gate insulating film 15d and a gate electrode 15e, where the gate insulating film 15d is in contact with the upper surface of the semiconductor layer 10 and the gate electrode 15e is provided over the semiconductor layer 10 with the gate insulating film 15d interposed therebetween. Silicide 15a may be formed on the top of the gate electrode 15e. While FIG. 2 shows the silicide 15a, gate insulating film 15d, and a sidewall 15b provided on a side of the gate electrode 15e, they are omitted in FIG. 1.

The gate structure 15 has a closed-loop portion 150 on the upper surface of the element isolation portions 14 and the semiconductor layer 10 which forms a closed loop. In the plane view, the closed loop crosses the boundaries between the element isolation portions 14 and the semiconductor layer 10 and is kept away from the body potential fixing portions 13. Note that the semiconductor layer 10 is drawn in FIG. 1 as the drain 11, sources 12 and the body potential fixing portions 13 which are formed by introducing impurities into the semiconductor layer 10. However, the semiconductor layer 10 remains as the body 10a under the gate structure 15.

The drain 11 is an n⁺-type impurity region formed from the upper surface of the semiconductor layer 10 to its lower surface. While it is surrounded by the gate structure 15 and the element isolation portions 14 in the plane view, it is actually surrounded by the under semiconductor layers 10b and the bodies 10a. Silicide (not shown) may be provided on the top of the drain 11.

Each source 12 too is an n⁺-type impurity region formed from the upper surface of the semiconductor layer 10 to its lower surface. It faces to the drain 11 through the body 10a. It is separated from the body potential fixing portions 13 by the under semiconductor layers 10b. Silicide 12a may be provided on the top of the sources 12.

In the structure explained above, the gate structure 15 extends over the boundaries between the element isolation portions 14 and the semiconductor layer 10, so that the p⁻-type body 10a is connected to the body potential fixing portion 13 through the under semiconductor layer 10b without through the pn junctions formed between the body 10a and the drain 11 and source 12 which are both n⁺-type. Accordingly the potential at the body 10a can be externally fixed via the contact 13c. This reduces the noise caused by the floating state of the body and avoids the reduction in breakdown voltage between the source and drain due to the parasitic bipolar phenomenon. Furthermore, since the source 12 and the body potential fixing portion 13 are separated by the element isolation portion 14, there is no semiconductor region in which ions of different conductivity types are mixed, which allows favorable application of the silicidation.

The contacts to the drain 11 and the sources 12 are shown as the contacts 11c and 12c, respectively. The sources 12 formed outside the closed-loop portion 150 can be formed in larger areas than the drain 11 formed inside the closed-loop portion 150. Accordingly, the flow of the drain current can be expanded and a larger number of contacts 12c can be provided for the sources 12. This reduces the source resistance $R_s$, which increases the maximum oscillation frequency $f_{max}$ and reduces the minimum noise figure $F_{min}$ as can be seen from the equations described before. Furthermore, the drain 11 can be set small, which suppresses the gate-drain capacitance $C_{dg}$ and increases the maximum oscillation frequency $f_{max}$.

Moreover, the gate pads 151 serving as the contact pads to the gate electrode 15e can be formed on the element isolation portions 14. Thus the distance between the gate pads 151 and the semiconductor layer 10 can be enlarged, which suppresses the gate-source capacitance $C_{gs}$, increases the maximum oscillation frequency $f_{max}$, and reduces the minimum noise figure $F_{min}$.

Furthermore, in the plane view, the gate structure 15 is formed on the upper surface of the element isolation portions 14 and the semiconductor layer 10 and crosses the boundaries between the element isolation portions 14 and the semiconductor layer 10, so that the distance between the gate structure 15 on the body 10a and the gate pad 151 can be reduced, which reduces the gate resistance $R_g$, further increases the maximum oscillation frequency $f_{max}$, and reduces the minimum noise figure $F_{min}$.

When considering one element isolation portion 14, one drain 11 surrounded by a gate structure 15 and a plurality of sources 12 are alternately arranged around it. While a plurality of transistors are thus formed around the element isolation portion 14, these transistors adopt a common body potential fixing portion 13, which reduces the layout area and facilitates the layout process.

Figure 3:
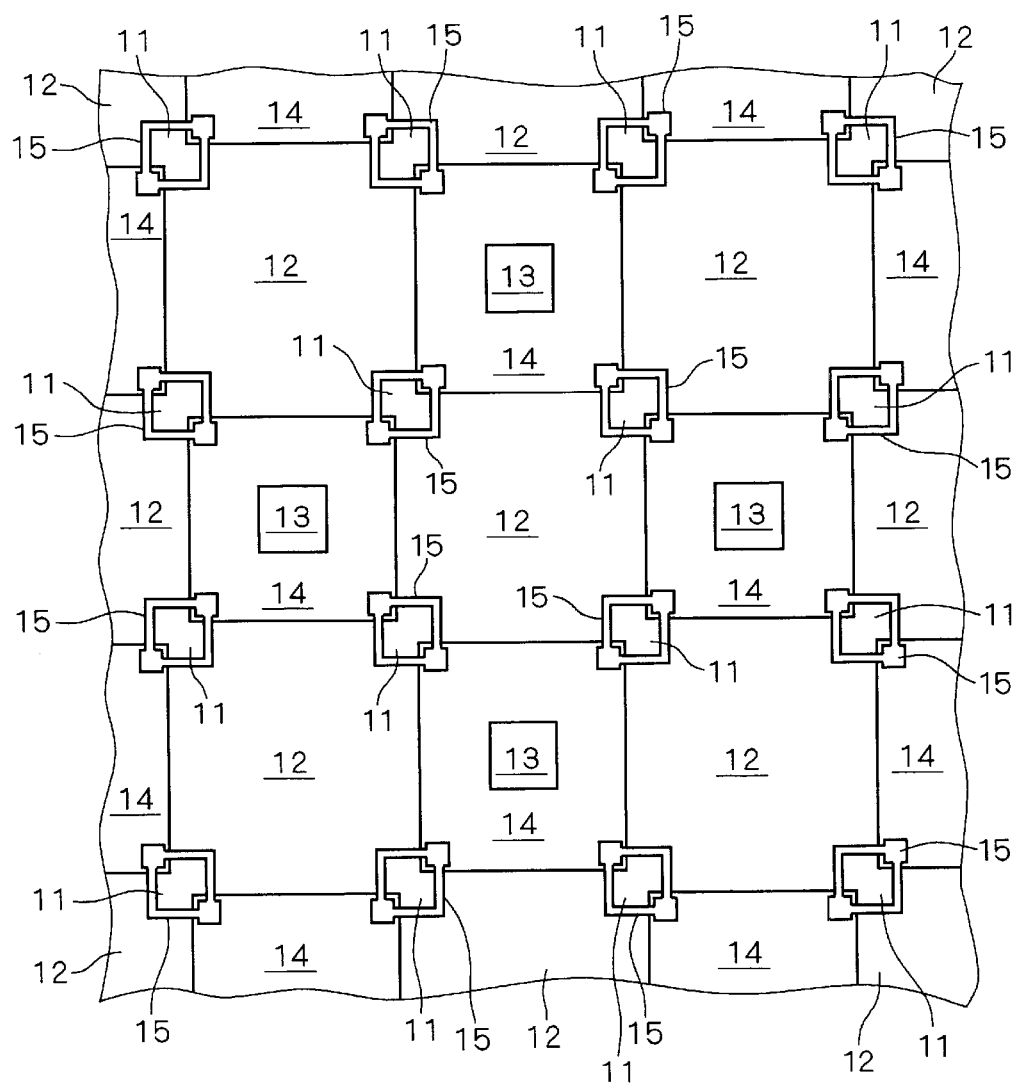
FIG. 3 is a plan showing a structure according to a modification of the first preferred embodiment of the invention.

A plurality of transistors can be formed in an array by repeatedly arranging the pattern shown in FIG. 1 in the plane view, and a large current can be passed. FIG. 3 shows an example of a structure modified in this way.

In the plane view, each body potential fixing portion 13 is surrounded by an element isolation portion 14, and therefore the body potential fixing portion 13 is surrounded in the semiconductor layer 10 by the under semiconductor layer 10b shown in FIG. 2. The element isolation portions 14 are each formed in an approximately rectangle shape in the plane view, and their vertexes are coupled with each other by the gate structures 15. The element isolation portions 14 are arranged checkerwise. Hence, in most cases, one source 12 is surrounded by two pairs of gate structures 15 and two pairs of element isolation portions 14. Each gate structure 15 has the gate pads 151 on two element isolation portions 14.

In the structure shown in FIG. 3, adjacent transistors adopt a drain in common and the sources can be easily formed in larger area.

Figure 4:
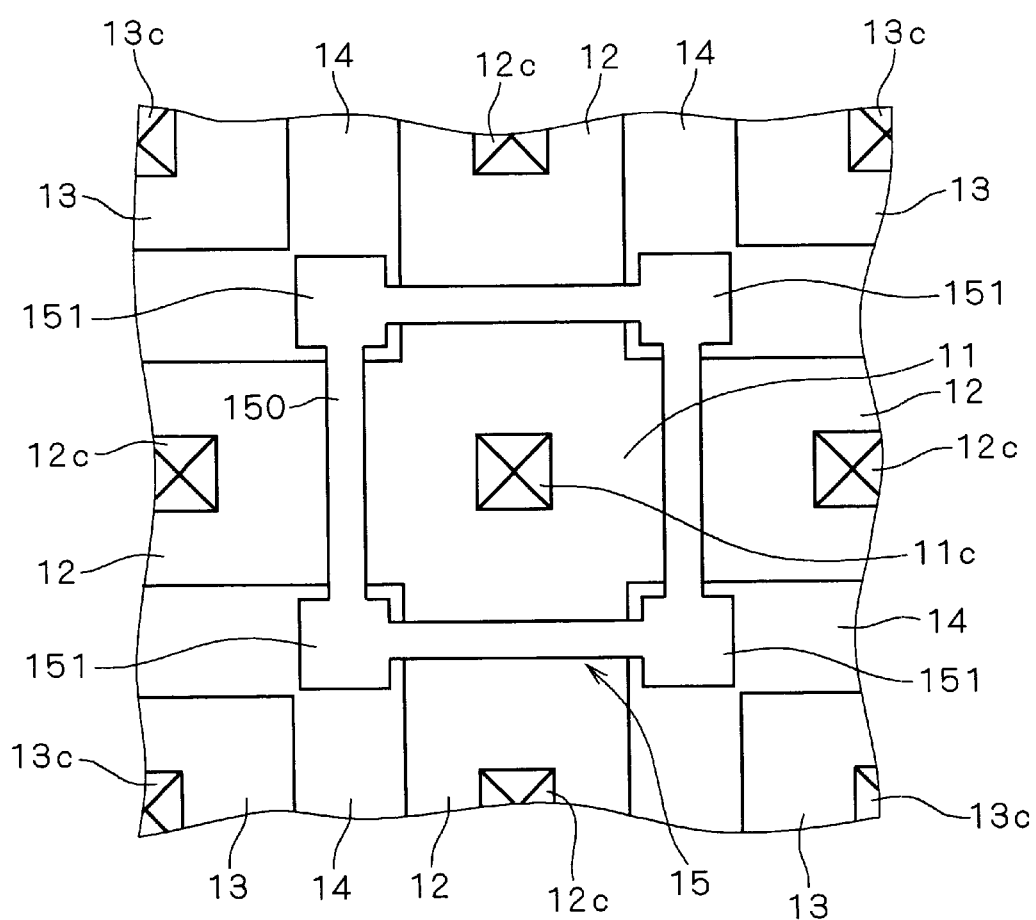
FIG. 4 is a plan showing a structure according to a second preferred embodiment of the invention.

Second Preferred Embodiment:

FIG. 4 is a plan showing the structure of an SOIMISFET according to a second preferred embodiment of the invention. This structure differs from that shown in FIG. 1 in that the gate structure 15 is in close proximity to the body potential fixing portions 13 in four directions in the plane view. Similarly to that in the first preferred embodiment, each body potential fixing portion 13 is separated by the element isolation portion 14 from the drain 11 and the sources 12 in the plane view. The gate structure 15 has a gate pad 151 on each of the four element isolation portions 14 interposed between the gate structure 15 and the four body potential fixing portions 13.

In this way, since a larger number of body potential fixing portions 13 are connected to the body 10a than in the first preferred embodiment, the function of fixing the potential at the body 10a is enhanced. This reduces the noise due to the floating state of the body and prevents the reduction in the breakdown voltage between the source and drain due to the parasitic bipolar phenomenon.

Furthermore, since the gate structure 15 has an increased number of gate pads 51, the gate resistance $R_g$ can be almost halved. This increases the maximum oscillation frequency $f_{max}$ and reduces the minimum noise figure $F_{min}$.

The area of the sources 12 is smaller than that in the first preferred embodiment, which may increase the source resistance $R_s$. However, the sources 12 adjacent to the bodies 10a (FIG. 2) under the gate structure 15 are ensured. Further, the contacts 12c for the sources 12 outnumber the contacts 11c for the drains 11, and they can be further enlarged. Therefore the characteristics of the transistors are not considerably deteriorated. As in the first preferred embodiment, the area of the drain 11 can be reduced to decrease the gate-drain capacitance $C_{dg}$ and increase the maximum oscillation frequency $f_{max}$.

Figure 5:
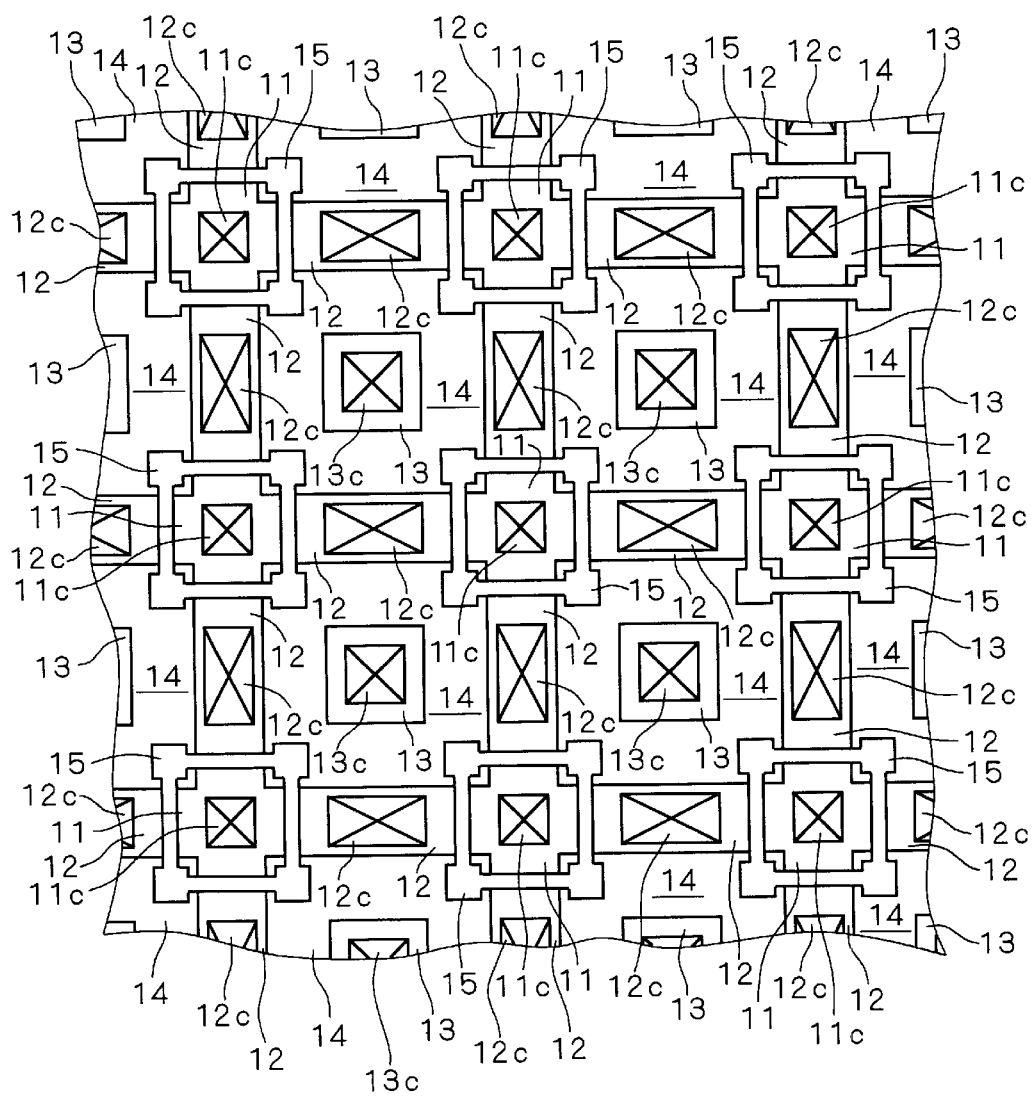
FIG. 5 is a plan showing a structure according to a modification of the second preferred embodiment of the invention.

A plurality of transistors can be formed in an array by repeatedly arranging the pattern shown in FIG. 4 in a plane view, which allows passage of a large current. FIG. 5 shows an example of a structure modified in this way.

In the plane view, a body potential fixing portion 13 is surrounded by an element isolation portion 14, and therefore the body potential fixing portion 13 is surrounded in the semiconductor layer 10 by the under semiconductor layer 10b shown in FIG. 2. The element isolation portions 14 are each formed in an approximately rectangle shape in the plane view and their vertexes are coupled with each other by the gate structures 15. The element isolation portions 14 are arranged in a matrix. Hence, in most cases, one source 12 is surrounded by a pair of gate structures 15 and a pair of element isolation portions 14.

Figure 6:
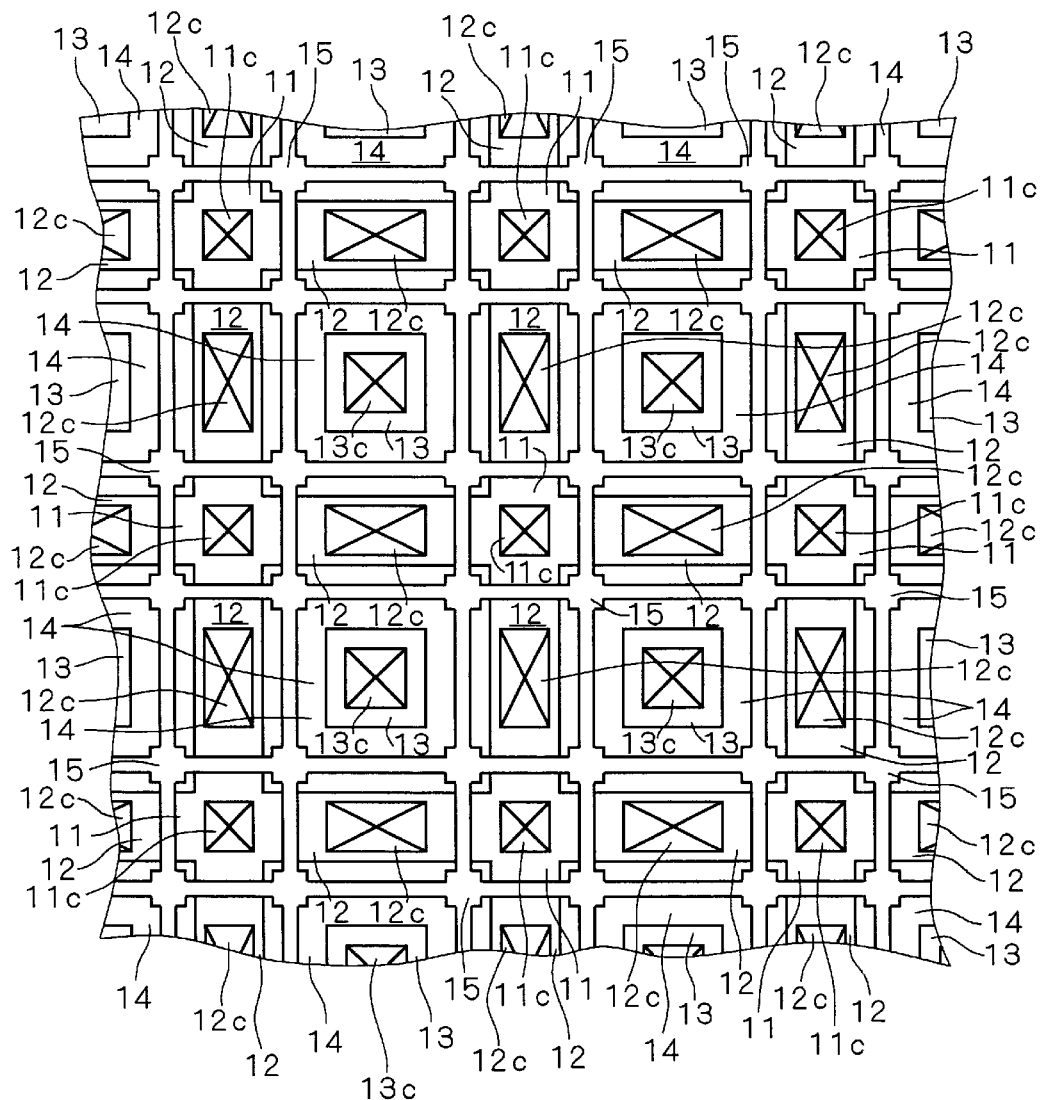
FIG. 6 is a plan showing a structure according to another modification of the second preferred embodiment of the invention.

In the structure shown in FIG. 5, too, adjacent transistors adopt a drain 11 in common and the sources 12 can be easily enlarged. For another modification, as shown in FIG. 6, adjacent gate structures 15 may be connected to each other. The sizes of the contacts 11c and 12c are not limited to those shown in the diagrams, and the same effect can be obtained when they are manufactured on a different scale.

Figure 7:
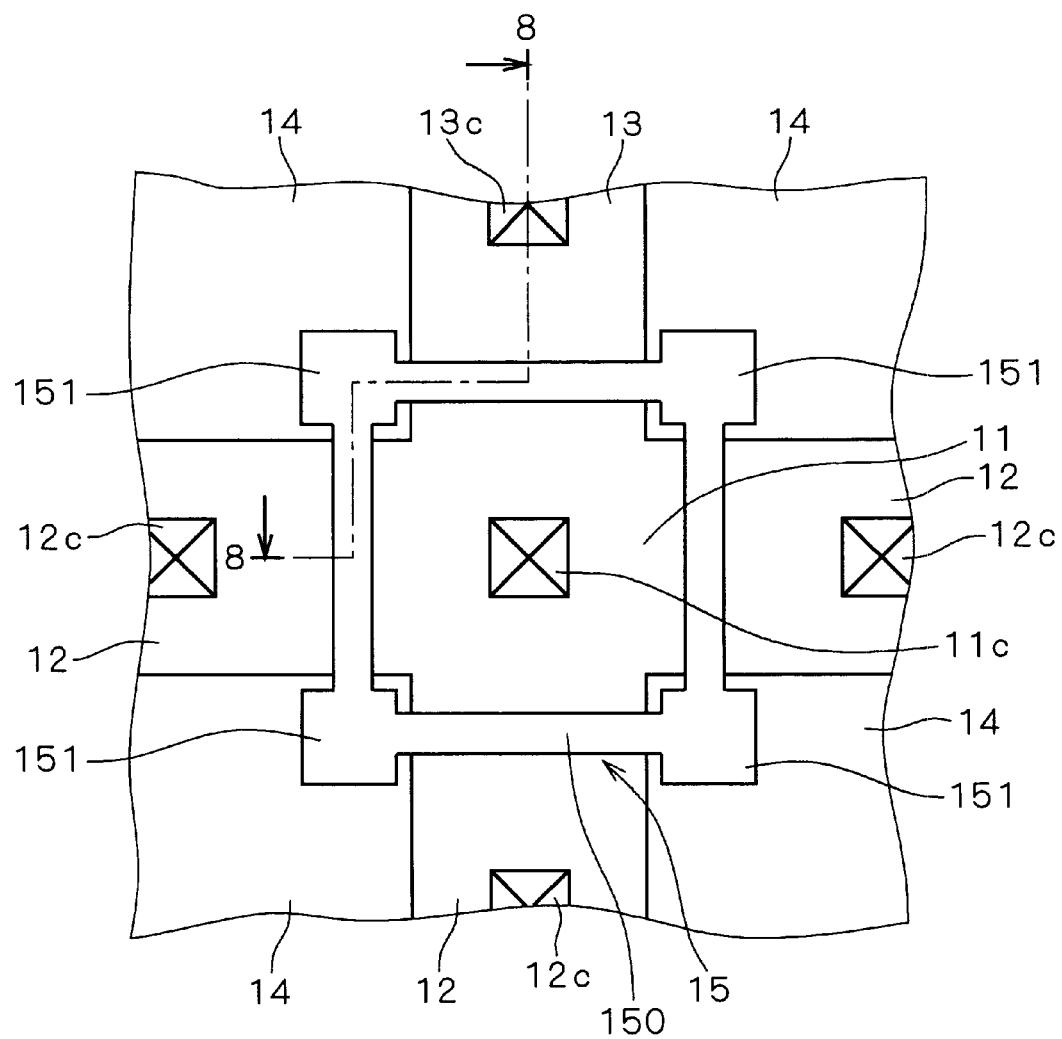
FIG. 7 is a plan showing a structure according to a third preferred embodiment of the invention.

Third Preferred Embodiment:

FIG. 7 is a plan showing the structure of an SOIMISFET according to a third preferred embodiment of the invention. In this preferred embodiment, in the plane view, like the structure shown in FIG. 4, the gate structure 15 has a gate pad 151 on each of the element isolation portions 14 located in close proximity in the four directions. In the plane view, however, while the body potential fixing portion 13 is separated from the sources 12 by the element isolation portions 14, it is separated from the drain 11 by part of the gate structure 15. FIG. 7 shows an example in which the closed-loop portion 150 approximately forms a rectangle having the gate pads 151 at its vertexes and the drain 11 faces to the body potential fixing portion 13 along one of its sides and to the sources 12 along the remaining three sides.

Figure 8:
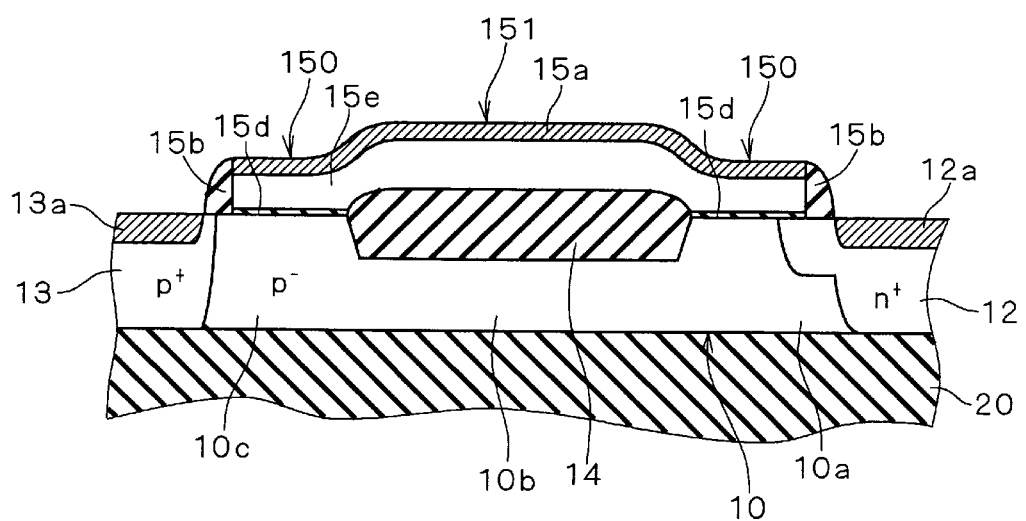
FIG. 8 is a sectional view showing the structure of the third preferred embodiment of the invention.

FIG. 8 is the sectional view showing the structure of FIG. 7 from the direction of the arrows 8—8. In the semiconductor layer 10, the body potential fixing portion 13 is in direct contact with the under semiconductor layer 10c where channel is not formed in the semiconductor layer 10 under the gate structure 15. The body 10a is sandwiched between the drain 11 and the source 12 and the channel is formed in the part closer to the gate structure 15. However, since the gate structure 15 forms a closed loop in the plane view and crosses the boundaries between the element isolation portions 14 and the semiconductor layer 10, the under semiconductor layer 10c and the body 10a are connected through the under semiconductor layer 10b beneath the element isolation portion 14. Accordingly the potential at the body 10a is connected to the body potential fixing portion 13 not only through the under semiconductor layer 10b but also through the under semiconductor layer 10c which does not function as the body, so that the body potential can be efficiently fixed.

Figure 9:
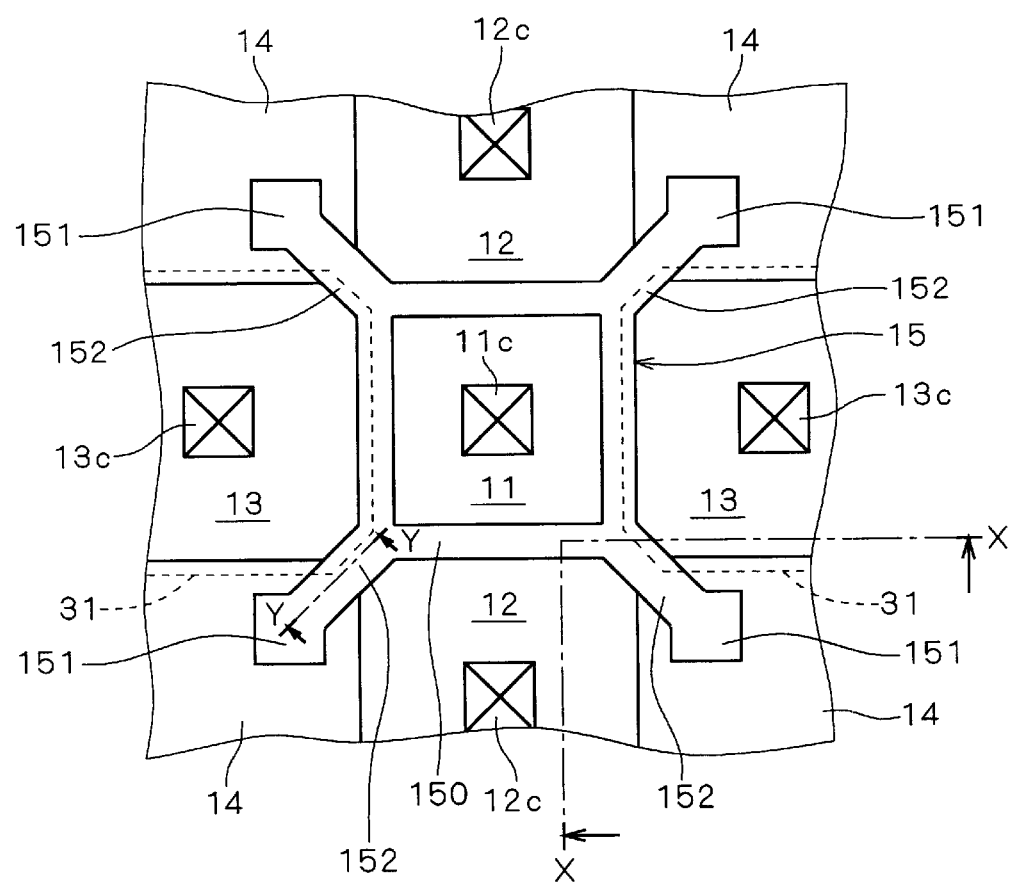
FIG. 9 is a plan showing a structure according to a fourth preferred embodiment of the invention.
Figure 10:
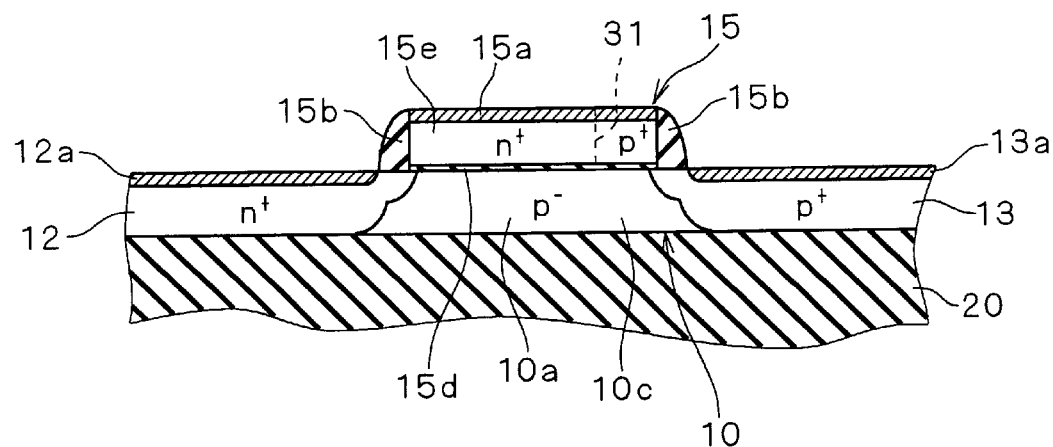
FIGS. 10 to 13 are sectional views showing structures according to the fourth preferred embodiment of the invention.

Fourth Preferred Embodiment:

FIG. 9 is a plan showing the structure of an SOIMISFET according to a fourth preferred embodiment of the invention and FIG. 10 is the sectional view showing the structure of FIG. 9 from direction of the arrows X—X. As in the first to third preferred embodiments described above, a p⁻-type semiconductor layer 10 is formed on the main surface of the insulating film 20; the semiconductor layer 10 has an upper surface and a lower surface which is in contact with the main surface of the insulating layer 20. The gate structure 15 is formed on the upper surface of the semiconductor layer 10. FIG. 9 does not show the sidewalls 15b shown in FIG. 10.

The third preferred embodiment showed an example in which the gate structure 15 has, in the plane view, a rectangle-shaped closed-loop portion 150 and gate pads 151 arranged on its vertexes. In this preferred embodiment, however, the gate structure 15 further has four extensions 152 coupled between the closed-loop portion 150 and the corresponding gate pads 151.

Figure 11:
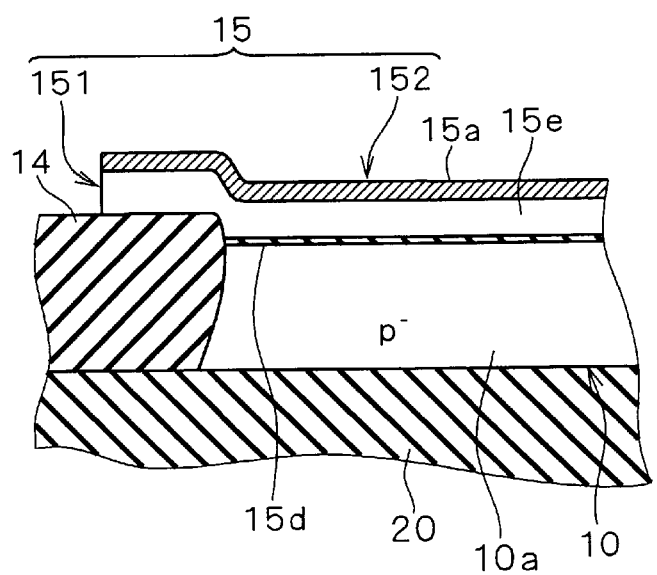
Figure 12:
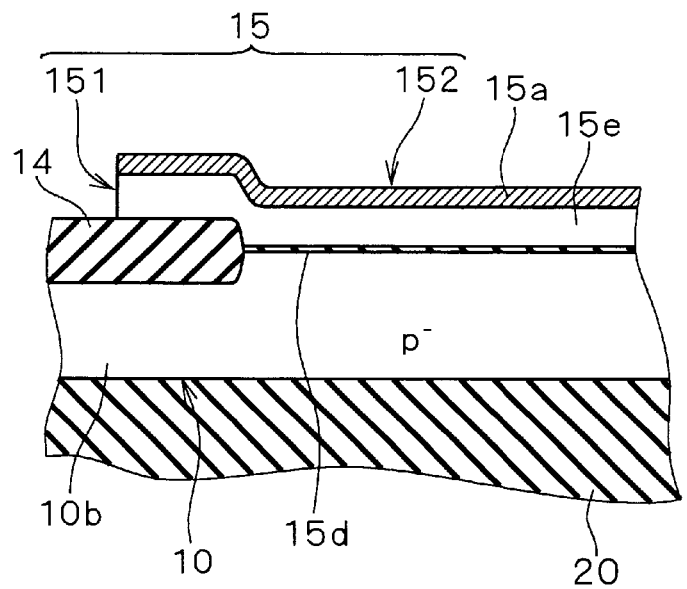

The element isolation portions 14, which are insulating, are formed on the upper surface of the semiconductor layer 10, where the under semiconductor layer 10b (FIGS. 2 and 8) may be present between the element isolation portions 14 and the insulating layer 20 as shown in the first to third preferred embodiments. In this preferred embodiment, however, the element isolation portions 14 may reach the lower surface of the semiconductor layer 10, or the insulating layer 20. FIGS. 11 and 12 both correspond to the section of the structure of FIG. 9 seen from the arrow direction Y—Y; FIG. 11 shows a structure in which the element isolation portion 14 reaches the lower surface of the semiconductor layer 10 and FIG. 12 shows a structure in which the element isolation portion 14 does not reach the lower surface of the semiconductor layer 10. In the former structure, the semiconductor layer 10 is absent between the insulating layer 20 and the element isolation portion 14, which is desirable in that the capacitance of the gate pad 151 can be reduced. The latter structure allows the body potential to be easily fixed as in the first to third preferred embodiments. The two structures can be used depending on the application. The two sectional structures can be mixed in a device. FIG. 9 shows an example in which the gate structure 15 has the gate pads 151 on the element isolation portions 14 located in close proximity to it in the four directions in the plane view.

Figure 13:
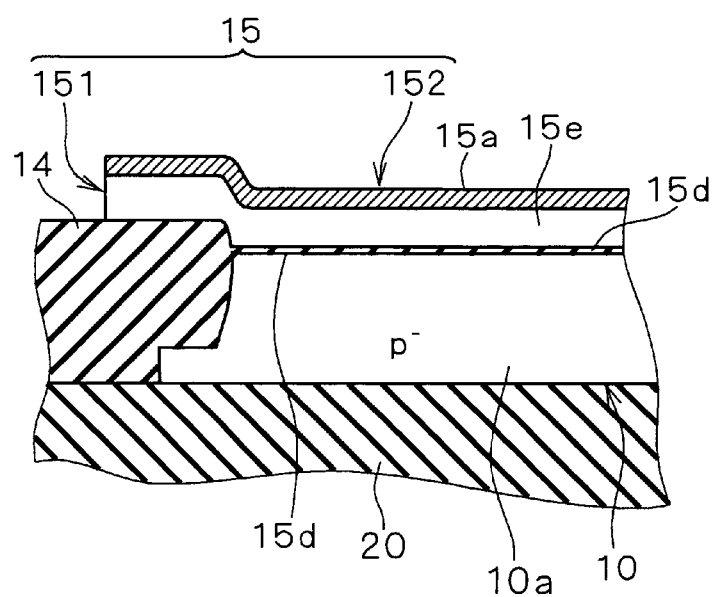

FIG. 13 is a sectional view showing a modification of the element isolation portion 14. Similarly to the structure shown in FIG. 11, the element isolation portion 14 reaches the insulating layer 20. In the position shown in this section, the element isolation portion 14 is larger in the vicinity of the gate pad 151 than in the vicinity of the insulating layer 20. This structure too is desired in that the capacitance of the gate pad 151 can be reduced.

The body 10a and the under semiconductor layer 10c exist between the closed-loop portion 150 and the lower surface of the semiconductor layer 10. The body 10a is interposed between the drain 11 and the source 12, where a channel is formed. The under semiconductor layer 10c is interposed between the drain 11 and the body potential fixing portion 13, where no channel is formed. The under semiconductor layer 10c is in contact with the body 10a.

From a different point of view, each body potential fixing portion 13 is separated from the drain 11 by the under semiconductor layer 10c beneath the closed-loop portion 150 and isolated from the sources 12 by the regions under the extensions 152 of the gate structure 15 and, if present, the under semiconductor layers 10b beneath the element isolation portions 14. In this preferred embodiment the under semiconductor layer 10c in which no channel is formed exists under the extensions 152. FIG. 9 shows an example in which a pair of body potential fixing portions 13 and a pair of sources 12 are formed around one drain 11.

The drain 11, sources 12, and body potential fixing portions 13 are all formed from the upper surface of the semiconductor layer 10 down to its lower surface, and silicidation may be applied to their top surfaces.

In the first to third preferred embodiments, the body potential fixing portions 13 are always separated from the sources 12 by the element isolation portions 14 and therefore the under semiconductor layers 10b must be present under the element isolation portions 14. In this preferred embodiment, however, the body potential fixing portions 13 are separated from the sources 12 also by the under semiconductor layers 10c beneath the extensions 152. That is to say, the body potential fixing portions 13 and the sources 12 are separated by the extensions 152 in the plane view, so that there is no semiconductor region in which ions of different conductivity types are mixed, which allows the silicidation process to be favorably performed.

The boundaries 31 indicate the position which defines the implantations of ions of different conductivity types. In this preferred embodiment, the drains 11 and the sources 12 are set to n$^+$-type and the body potential fixing portions 13 are set to p$^+$-type.

Hence, n$^+$-type ions are introduced into the gate electrode 15e over the bodies 10a, n$^+$-type ions are introduced into the extensions 152 of the gate electrode 15e on the side closer to the sources 12, and p$^+$-type ions are introduced into the gate electrode 15e on the side closer to the body potential fixing portions 13.

In this structure, each body potential fixing portion 13 is connected to the bodies 10a through the under semiconductor layer 10c, so that the bodies 10a can be fixed at a given potential. As in the first to third preferred embodiments, the gate pads 151 are formed on the element isolation portions 14 so that the drain can be formed in smaller area, and which provides the same effect.

Figure 14:
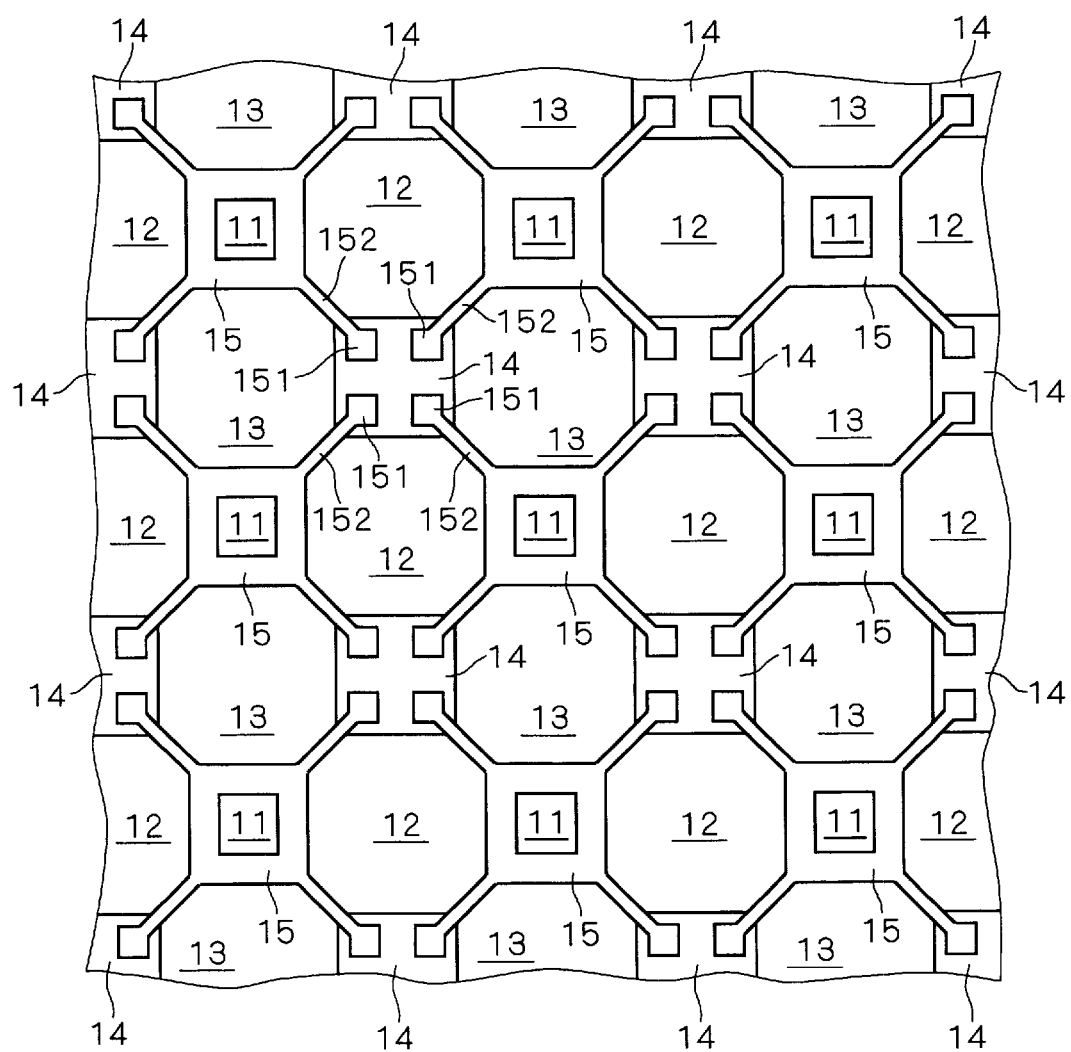
FIG. 14 is a plan showing a structure according to a first modification of the fourth preferred embodiment of the invention.

The pattern shown in FIG. 9 can be repeatedly arranged in the plane view to form a plurality of transistors in an array, where a large current can be passed. FIG. 14 shows an example of structure of a first modification of this preferred embodiment obtained in this way. Note that the contacts 1c, 12c and 13c are omitted in this diagram.

A body potential fixing portion 13 is surrounded by a pair of gate structures 15 and a pair of element isolation portions 14 in the plane view. The element isolation portions 14 are each formed in an approximately rectangle shape in the plane view, whose vertexes are coupled to different gate structures 15 through the four extensions 152. The element isolation portions 14 are arranged in a matrix. Accordingly, in most cases, one source 12 is surrounded by a pair of gate structures 15 and a pair of element isolation portions 14.

In the structure shown in FIG. 14, as in the structure shown in FIG. 3, adjacent transistors adopt a body 10a and a drain 11 in common, so that the sources 12 can be easily formed in larger area.

Figure 15:
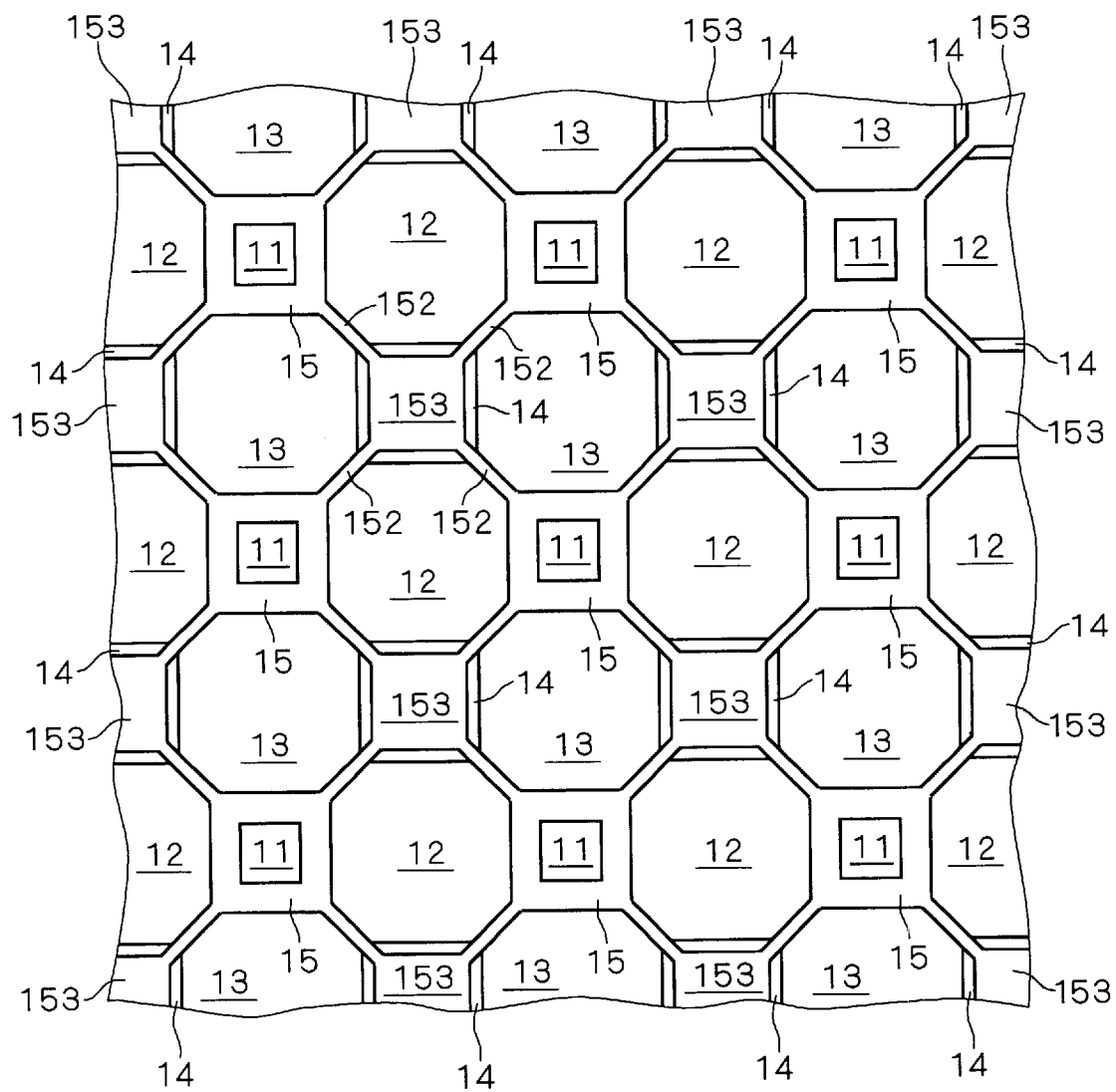
FIG. 15 is a plan showing a structure according to a second modification of the fourth preferred embodiment of the invention.

FIG. 15 is a plan showing the structure of a second modification of this preferred embodiment, in which, in the structure shown in FIG. 14, a single gate pad 153 is provided on one element isolation portion 14 and shared by the four gate structures 15 connected thereto. The resistance of the gate pad 153 can be reduced as compared with that of the gate pad 151, which reduces the gate resistance $R_g$, increases the maximum oscillation frequency $f_{max}$, and reduces the minimum noise figure $F_{min}$.

Figure 16:
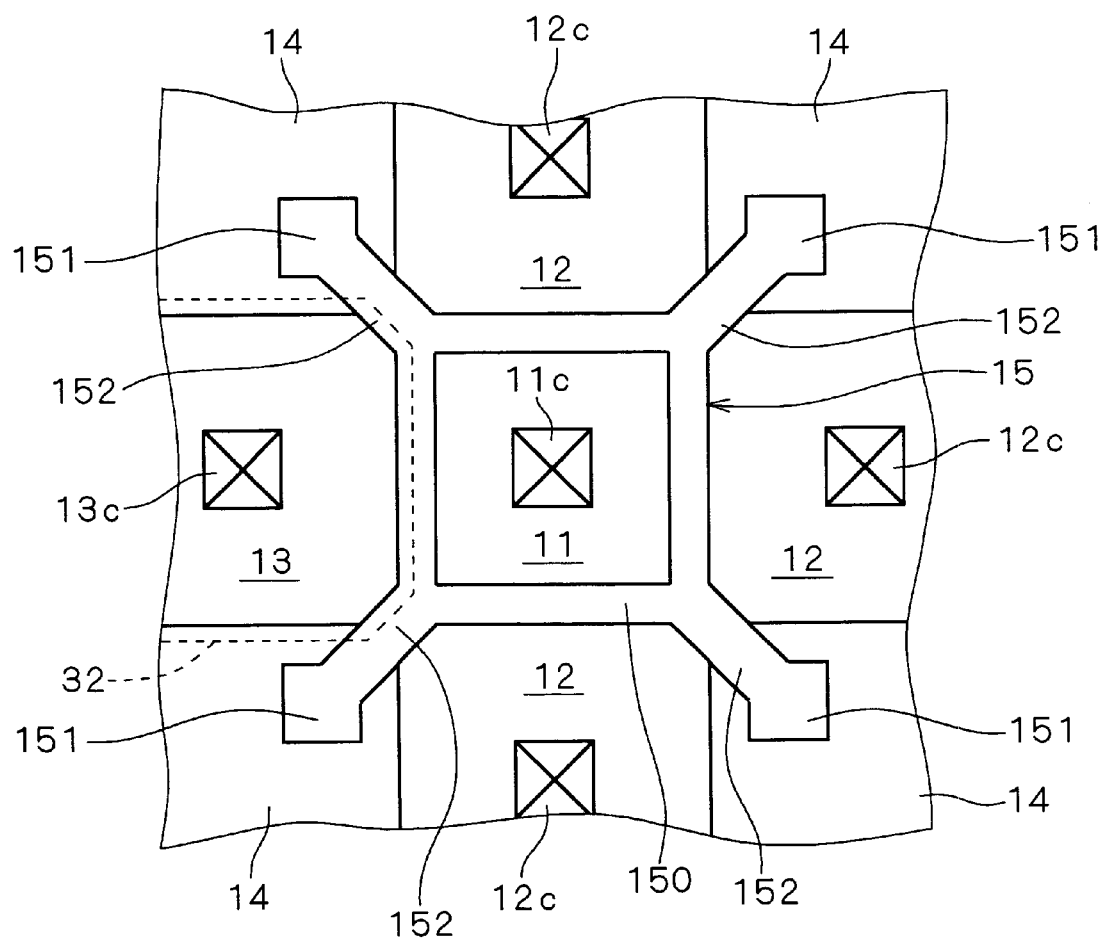
FIG. 16 is a plan showing a structure according to a third modification of the fourth preferred embodiment of the invention.

FIG. 16 is a plan showing the structure of a third modification of this preferred embodiment, in which one body potential fixing portion 13 and three sources 12 are formed around one drain 11. In this third modification, in the same way as the separation between the source 12 and the body potential fixing portion 13, a pair of adjacent sources 12 are separated by the under semiconductor layer 10c beneath the extension 152 and, if present, the under semiconductor layer 10b beneath the element isolation portion 14. In FIG. 16, the boundary 32 shows the position which defines the implantation of ions of different conductivity types.

Figure 18:
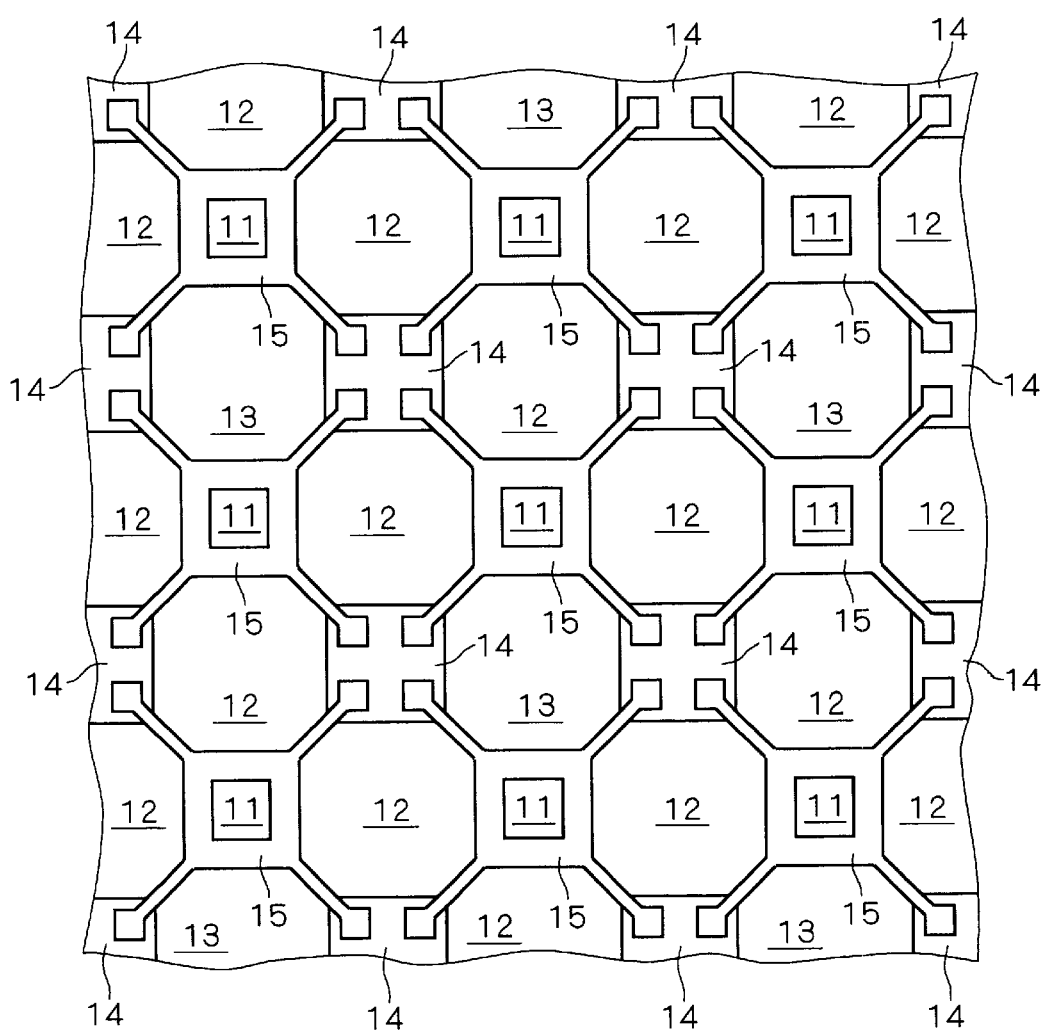

The pattern shown in FIG. 16 can be repeatedly arranged on the plane view to form a plurality of transistors in an array, where a large current can be passed. FIGS. 17 and 18 show examples of such structure according to a fourth modification of this preferred embodiment. Note that these diagrams do not show the contacts 11c, 12c and 13c.

In both of FIGS. 17 and 18, as in FIG. 14, a body potential fixing portion 13 is surrounded by a pair of gate structures 15 and a pair of element isolation portions 14 in the plane view. Each element isolation portion 14 is formed in an approximately rectangle shape in the plane view and its vertexes are coupled to different gate structures 15 through the four extensions 152. The element isolation portions 14 are formed in a matrix. In most cases, one source 12 is surrounded by a pair of gate structures 15 and a pair of element isolation portions 14.

However, unlike the structure obtained by arranging the structure of FIG. 9 (FIGS. 14, 15), a plurality of layouts are possible as shown in FIGS. 17 and 18 when the structure of FIG. 16 is repeatedly arranged in such a manner that the sources 12 and the body potential fixing portions 13 can be shared among adjacent transistors. In the layout shown in FIG. 17, as in FIG. 14, no source 12 is arranged in the rows in which the body potential fixing portions 13 are arranged in the lateral direction in the diagram. In the layout shown in FIG. 18, at least one source 12 is present between proximate body potential fixing portions 13.

Usually, in high-frequency transistors, the body potential is fixed at the source potential, so that the body potential fixing portions 13 and the sources 12 are often connected in common. This connection can be realized more easily in applications in which the body potential fixing portion 13 is surrounded by the sources 12 as shown in FIG. 18.

Different amounts of current flow in the sources 12 and the body potential fixing portions 13. However, in the layout shown in FIG. 18, the voltage drop tends to be uniform in the array of transistors, which improves the linearity of the characteristics. That is to say, it is less susceptible to deterioration of the performance even when a larger current flows.

Figure 19:
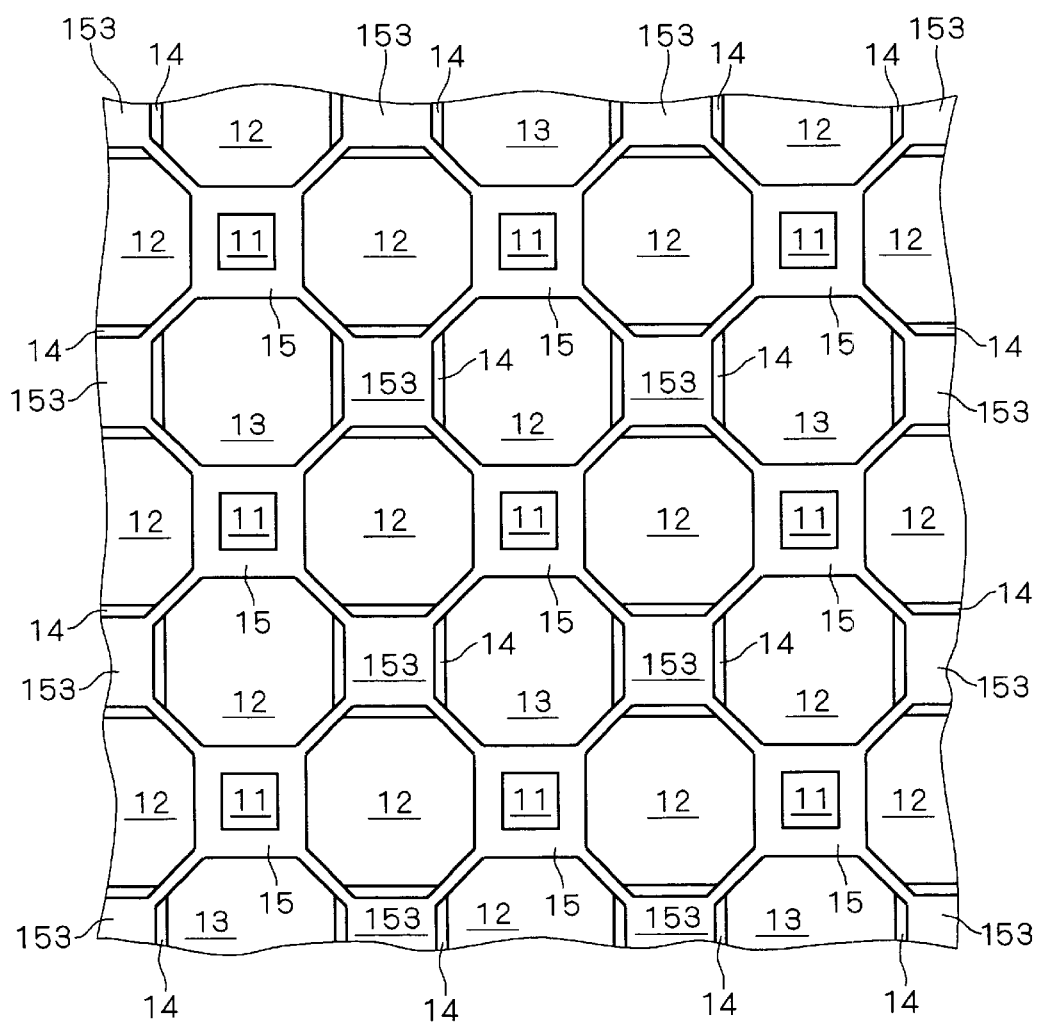
FIG. 19 is a plan showing a structure according to a further modification of the fourth modification of the fourth preferred embodiment of the invention.

FIG. 19 shows a layout corresponding to a further modification of FIG. 18, in which, as in the layout shown in FIG. 15, one gate pad 153 is provided on one element isolation portion 14 and shared by a plurality of gate structures 15. This reduces the resistance of the gate pads.

In the layouts shown in FIGS. 15 and 19, it is not always necessary to form the element isolation portions 14. However, in order to reduce the parasitic capacitance of the gate pads 153, it is desirable to provide the element isolation portions 14 between the gate pads 153 and the semiconductor layer 10.

In the layouts shown in FIGS. 15 and 19, the parasitic capacitance of the gate pads 153 can be reduced also by making the element isolation portions 14 and the gate pads 153 smaller, which also enhances the degree of integration.

Figure 20:
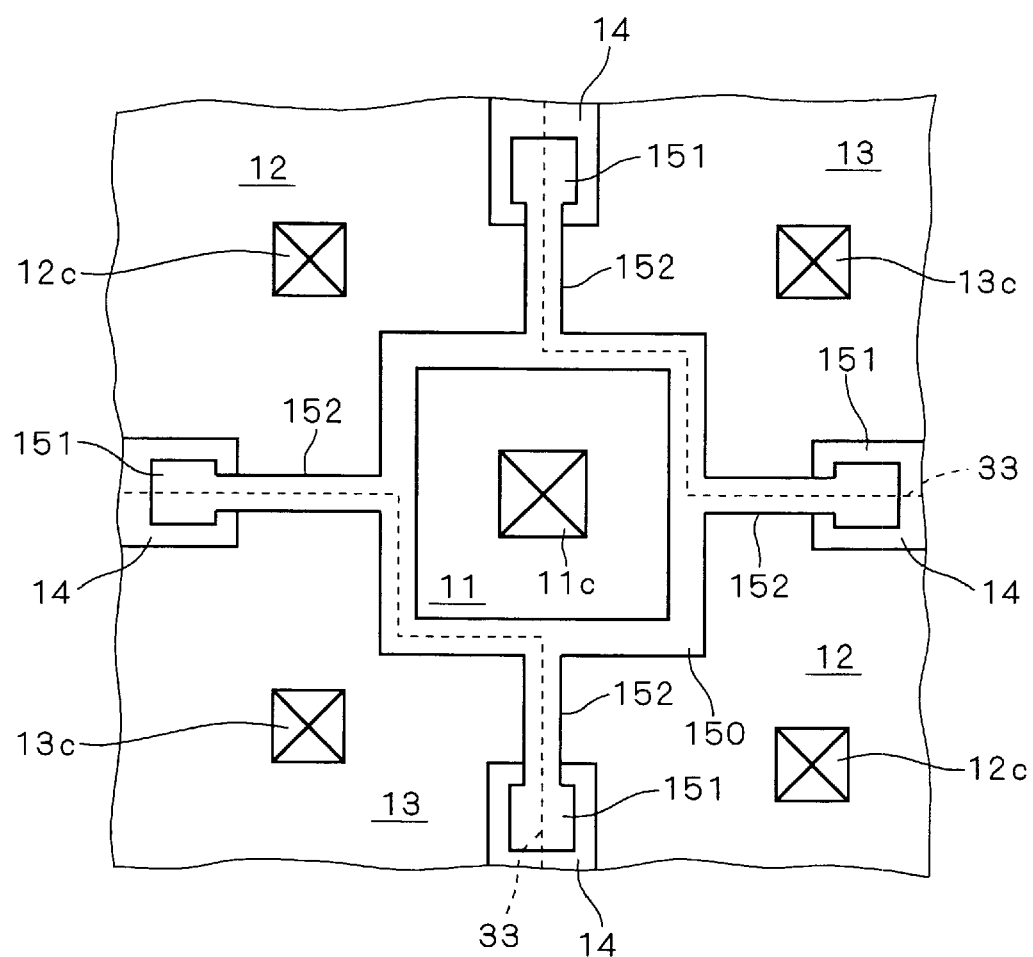
FIGS. 20 and 21 are plans showing structures according to a fifth preferred embodiment of the invention.
Figure 21:
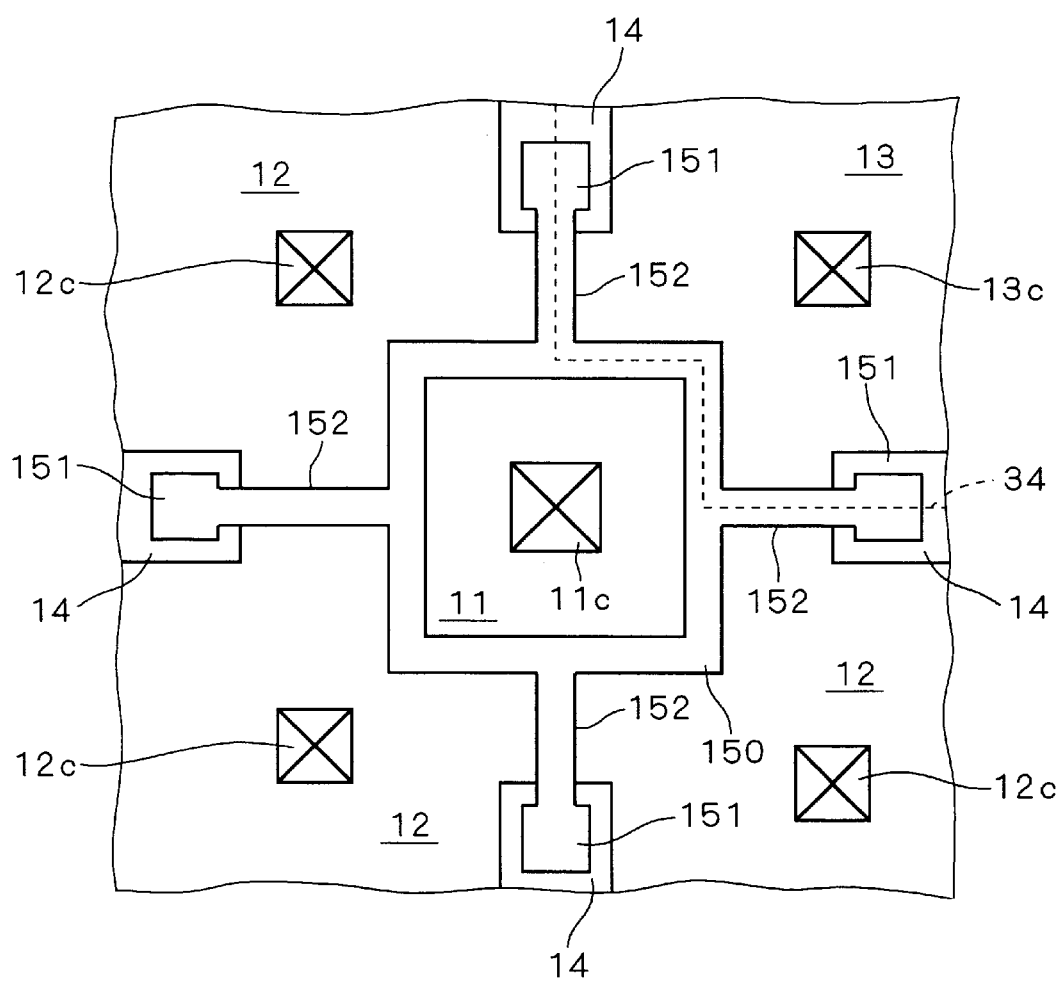

Fifth Preferred Embodiment:

FIGS. 20 and 21 are plans showing structures of SOIM-ISFETs according to a fifth preferred embodiment of the invention. The structures shown in FIGS. 20 and 21 are different respectively from those shown in FIGS. 9 and 16 in the fourth preferred embodiment in that the extensions 152 extend at right angles from the corresponding sides of the rectangle-shaped closed-loop portion 150.

Also in this preferred embodiment, the sources 12 and the body potential fixing portions 13 are connected to the drain 11 through the under semiconductor layer 10c beneath the closed-loop portion 150, so that the potential at the body 10a can be fixed from the body potential fixing portions 13 through the under semiconductor layer 10c.

The body potential fixing portions 13 is separated from the source 12 by the region under the extension 152 of the gate structure 15 and, if present, the under semiconductor layers 10b beneath the element isolation portions 14. Accordingly, no semiconductor region in which ions of different conductivity types are mixed is present and silicidation to the sources 12 and the body potential fixing portions 13 can be performed favorably. In FIGS. 20 and 21, the boundaries 33 and 34 show the positions which define the implantations of ions of different conductivity types.

Figure 23:
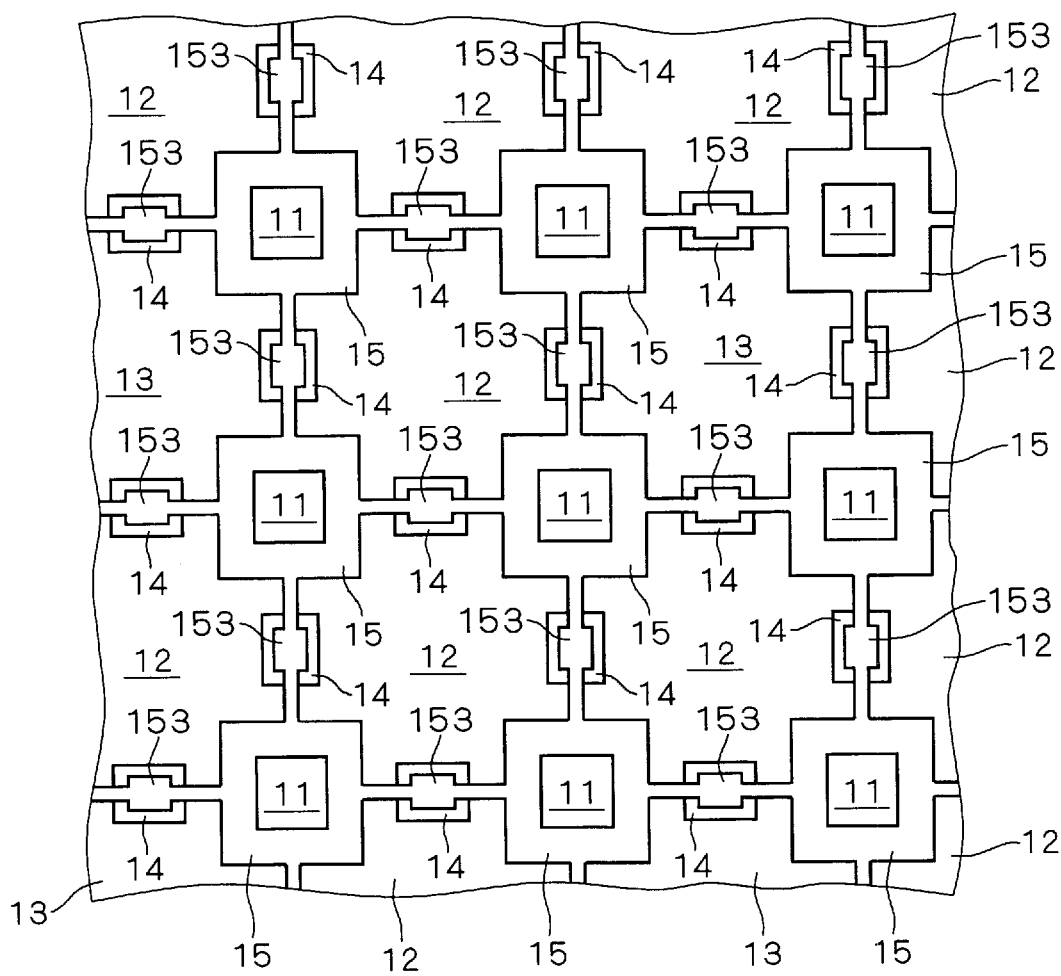

FIGS. 22 and 23 are plans showing a first modification of this preferred embodiment, which respectively show examples in which the structures shown in FIGS. 20 and 21 are repeatedly arranged to form a plurality of transistors in an array. Note that the contacts 11c, 12c and 13c are omitted in the drawings.

While the gate structures 15 are formed in a matrix like those in FIGS. 15 and 19 shown as the second and third modifications of the fourth preferred embodiment, one gate pad 153 is formed on one element isolation portion 14 and shared between two gate structures 15 unlike those in FIGS. 15 and 19.

As stated in the fourth preferred embodiment, it is desired that the magnitude of the voltage drop is uniform in an array of transistors. Therefore it is not desired that the body potential fixing portions 13 are arranged in one direction without the presence of source 12 therebetween. When, as in this preferred embodiment, the extensions 152 extend at right angles from the sides of the rectangle-shaped gate structures 15 are arranged in a matrix in parallel with their sides, and when the structure of FIG. 21 in which a drain 11 is surrounded by one body potential fixing portion 13 and three sources 12 is repeatedly arranged, then a source 12 is always interposed between adjacent body potential fixing portions 13. However, when the extensions 152 extend at right angles from the sides of the rectangle-shaped gate structures 15 are arranged in a matrix parallel with their sides, and when the structure in which a drain 11 is surrounded by two body potential fixing portions 13 and two sources 12 is repeatedly arranged, it is then desired that the two body potential fixing portions 13 and two sources 12 are alternately arranged around a drain 11 as shown in FIGS. 20 and 22 so that the body potential fixing portions 13 are not lined up in one direction without the presence of source 12.

Figure 24:
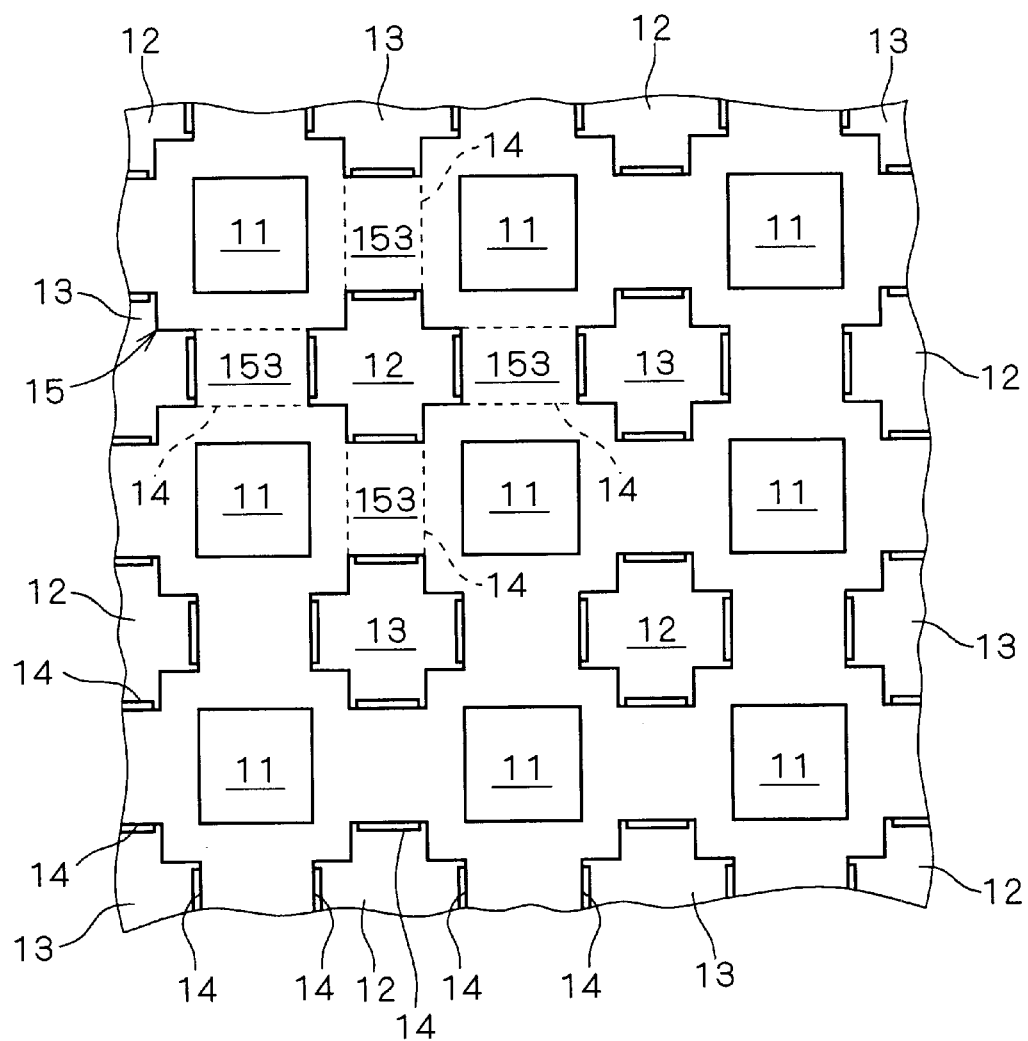
FIGS. 24 and 25 are plans showing a second modification of the fifth preferred embodiment of the invention.
Figure 25:
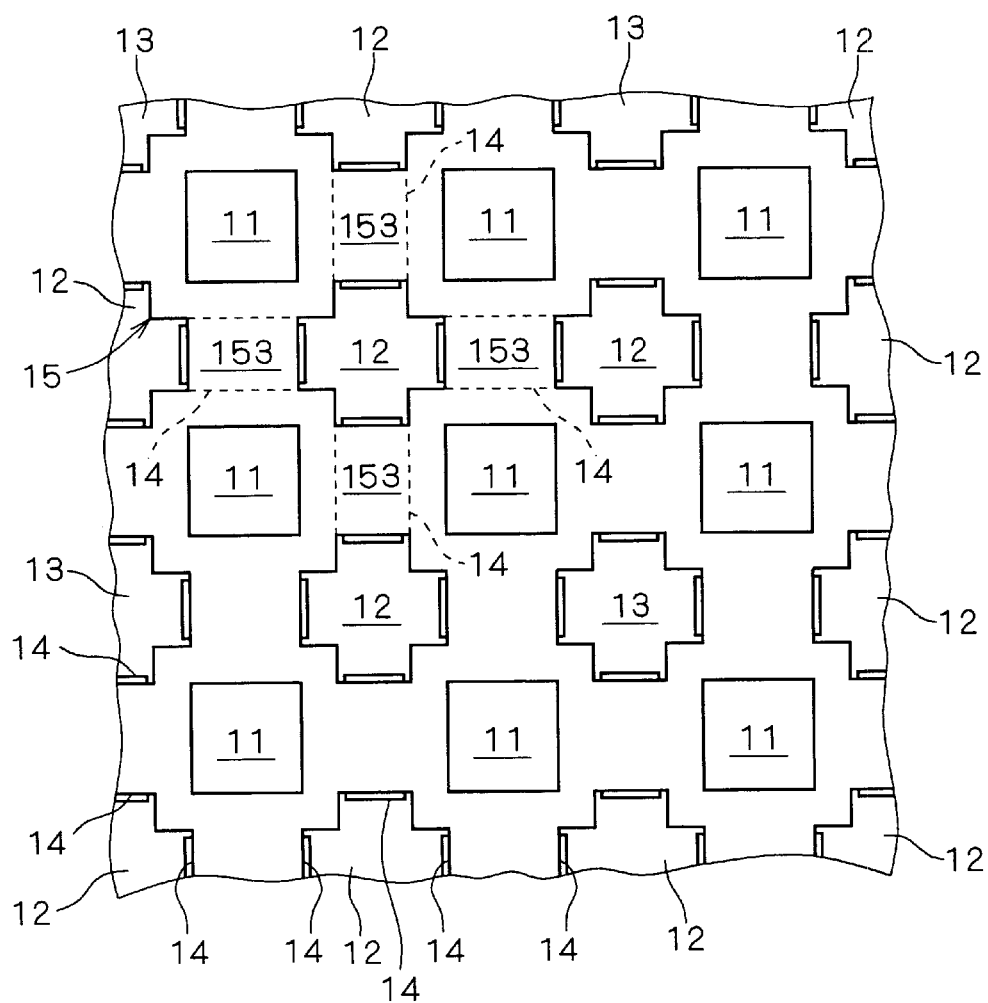

FIGS. 24 and 25 are plans showing a second modification of this preferred embodiment. These structures are obtained by modifying the structures shown in FIG. 22 and FIG. 23, respectively, as follows. That is, the element isolation portions 14 are extended to the vicinities of the closed-loop portions 150 and the gate pads 153 are also extended so that they are directly coupled to the closed-loop portions 150 without through the extensions 152. In some element isolation portions 14, their positions under the gate pads 153 are shown by the broken lines.

This layout is capable of not only enhancing the degree of integration but also reducing the capacitance and resistance parasitic on the extensions 152, which improves the maximum oscillation frequency $f_{max}$ and the minimum noise figure $F_{min}$.

In this layout, as in the layouts shown in FIGS. 15 and 19, it is not always necessary to form the element isolation portions 14, but it is desired, in order to reduce the parasitic capacitance of the gate pads 153, to provide the element isolation portions 14 between the gate pads 153 and the semiconductor layer 10.

Sixth Preferred Embodiment:

FIGS. 26 to 30 are plans showing structures of SOIMIS-FETs according to a sixth preferred embodiment of the invention. In the gate structures 15 shown in these drawings, the four extensions 152 shown in FIGS. 20 and 21 in the fifth preferred embodiment, which extend at right angles from the sides of the rectangle-shaped closed-loop portion 150, are added to the gate structure 15 shown in FIGS. 9 and 16 of the fourth preferred embodiment. Therefore a gate structure 15 has one closed-loop portion 150, eight extensions 152 arranged approximately at equal angles, and eighth gate pads 151 connected to the closed-loop portion 150 through the respective extensions 152. The gate pads 151 are provided on the corresponding element isolation portions 14. In these drawings, the contacts 11c, 12c and 13c are not shown and the extensions 152 are classified into two kinds; the extensions extending from the vertexes of the square of the closed-loop portion 150 are shown as 152a and the extensions extending at right angles from the sides are shown as 152b. The extensions 152a and 152b may be referred to as extensions 152 together in this preferred embodiment.

In FIGS. 26 to 30, eight, in total, sources 12 and body potential fixing portions 13 are arranged around a drain 11 surrounded by one closed-loop portion 150. FIGS. 26, 27, 28, 29 and 30 respectively show examples of patterns in which two, three, four, five, and six body potential fixing portions 13 are provided around one drain 11. When a smaller number of body potential fixing portions 13 are provided, an increased number of sources 12 can be provided, which is desirable for passage of larger current in the transistors. On the other hand, providing a larger number of body potential fixing portions 13 is desired to enhance the source-drain breakdown voltage and to suppress the noise.

In this preferred embodiment, the body potential can be fixed as in the fourth and fifth preferred embodiments. Since the body potential fixing portions 13 and the sources 12 are separated by the extensions 152 in the plane view, there is no semiconductor region in which ions of different conductivity types are mixed. This facilitates the silicidation process. The boundaries 35 to 39 show the positions defining the implantations of ions of different conductivity types in FIGS. 26 to 30, respectively.

Figure 26:
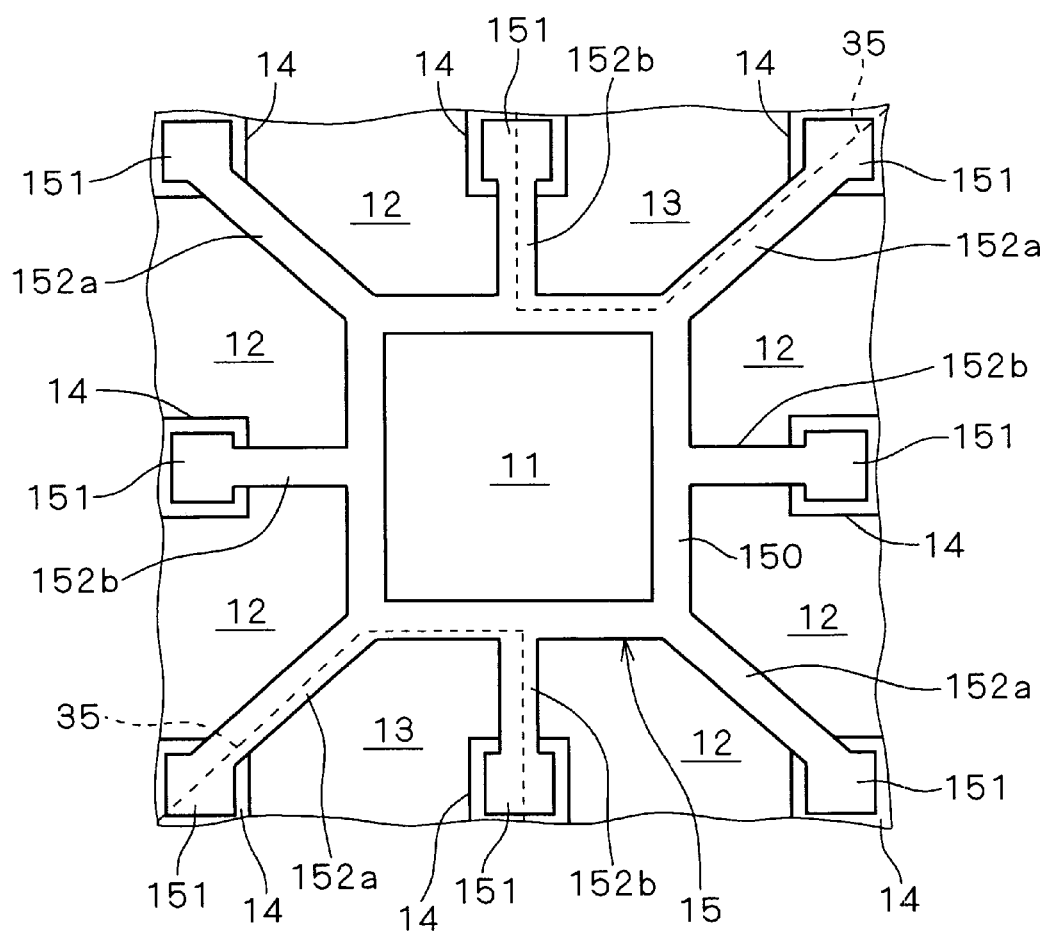
FIGS. 26 to 30 are plans showing structures according to a sixth preferred embodiment of the invention.
Figure 27:
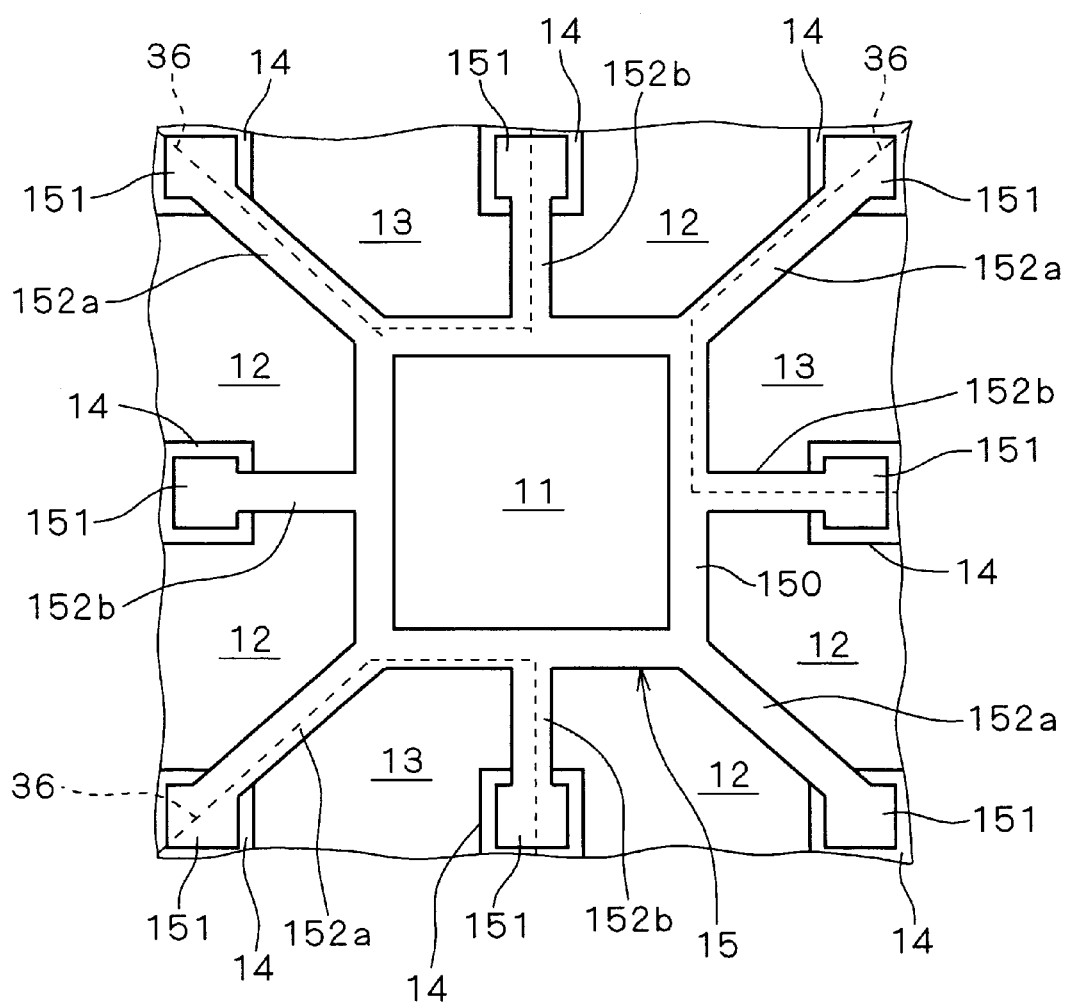
Figure 28:
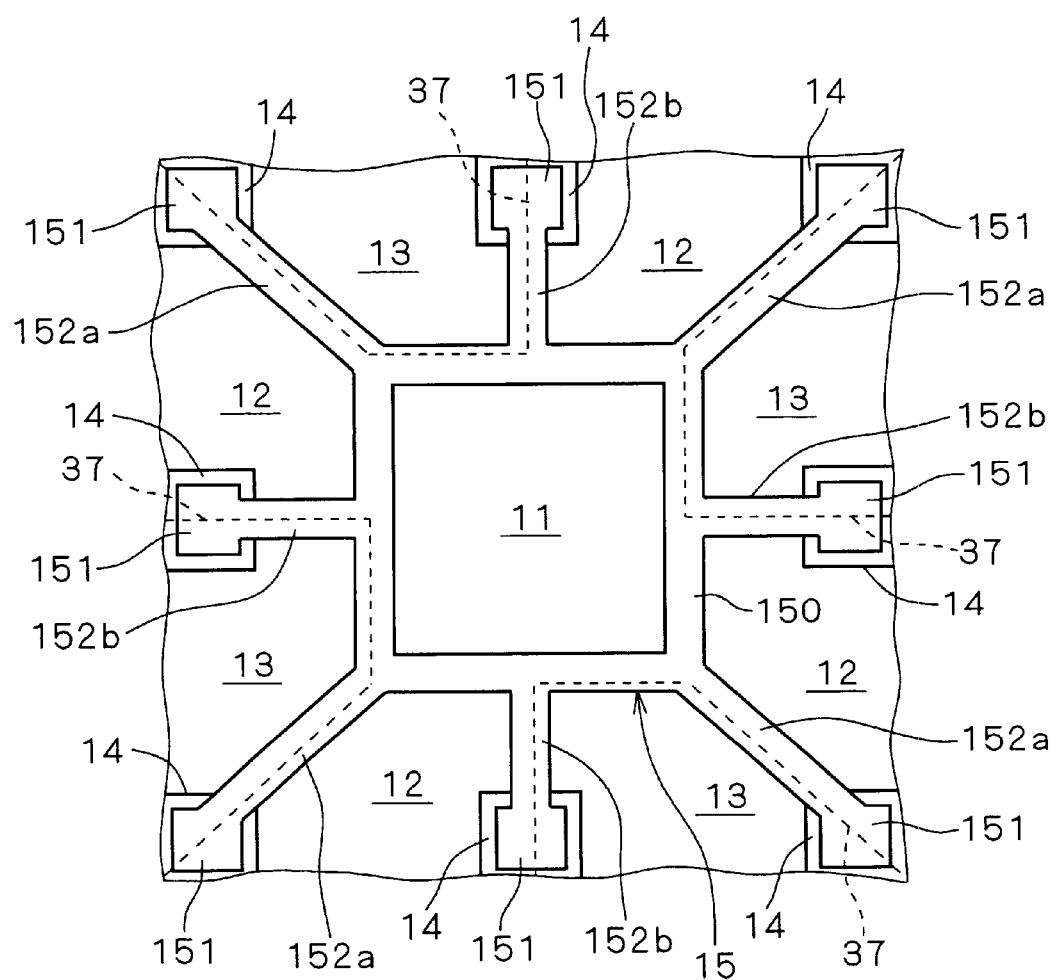

When the number of body potential fixing portions 13 provided around one drain 11 is half or less than the total number of sources 12 and body potential fixing portions 13 provided around one drain 11, that is, when it is four or less in this preferred embodiment, then a certain body potential fixing portion 13 always adjoins another body potential fixing portion 13 through one or more sources 12 and two or more extensions 152 as shown in FIGS. 26 to 28.

Figure 29:
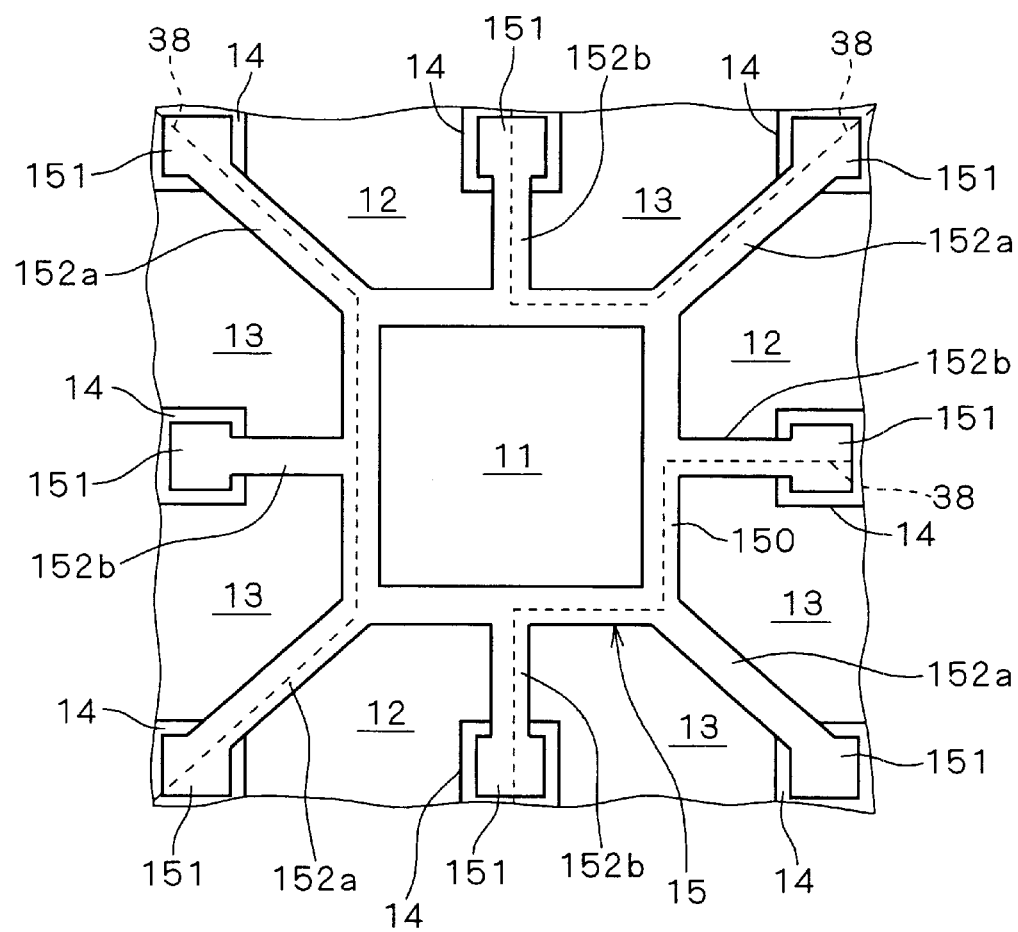
Figure 30:
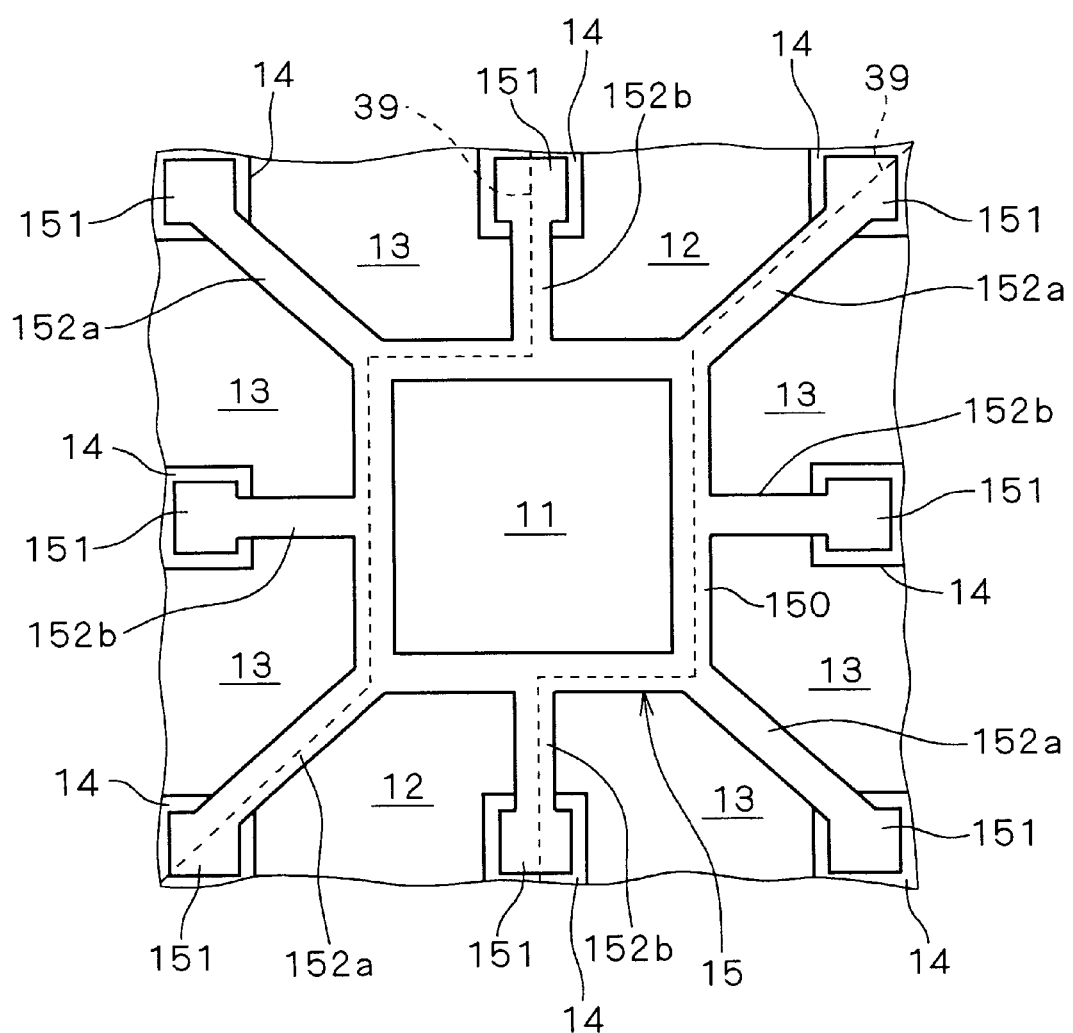

However, if not so, that is, if five or more body potential fixing portions 13 are provided in this preferred embodiment, it is inevitable that two body potential fixing portions 13 adjoin through one extension 152 and without through any source 12. When a plurality of sources 12 exist, it is desired, in order to suppress the non-uniformity of the current flowing in the transistors, that a certain source 12 adjoins another source 12 through one or more body potential fixing portions 13 and two or more extensions 152. FIGS. 29 and 30 show examples of such arrangement.

Figure 31:
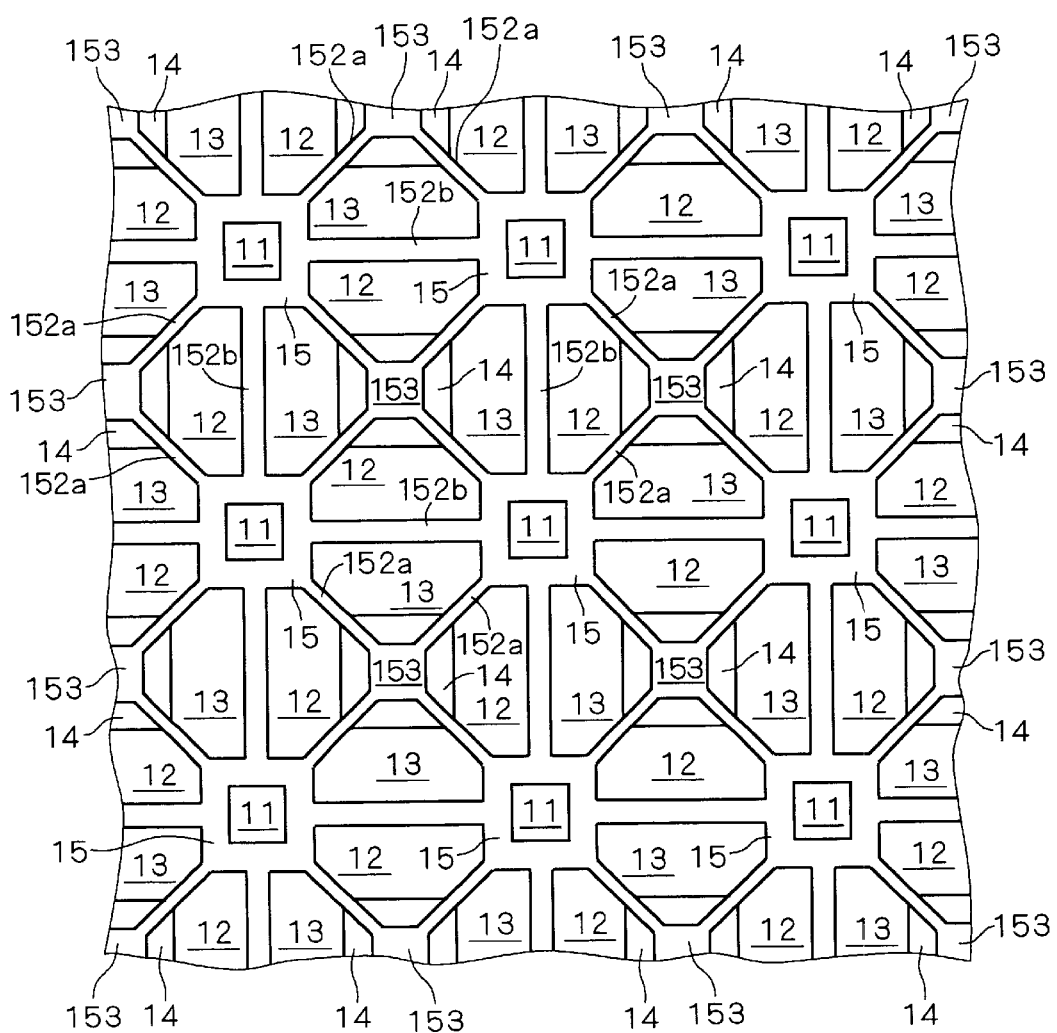

FIGS. 31 and 32 are plans showing modifications of this preferred embodiment, which show examples in which the structures shown in FIGS. 28 and 26, respectively, are repeatedly arranged to form a plurality of transistors in an array. The drawings do not show the contacts 11c, 12c and 13c.

In these modifications, the gate structures 15 are arranged in a matrix, where one element isolation portion 14 is surrounded by a rectangle formed by the proximate two pairs of gate structures 15. A gate pad 153 is provided on an element isolation 14, which connects four extensions 152a extending from the proximate four gate structures 15 in oblique directions with respect to the directions in which the rows and columns of the matrix are arranged. That is to say, a gate pad 153 is shared among the proximate four gate structures 15. However, unlike those shown in FIGS. 26 and 28, the extensions 152b extending in parallel with the row-and-column directions each couple adjacent two gate structures 15 to each other without through a gate pad 151.

If equal numbers of body potential fixing portions 13 and sources 12 are provided around one drain 11 as shown in FIG. 28, a pair of body potential fixing portions 13 and a pair of sources 12 are alternately arranged in the row-and-column directions, as shown in FIG. 31. This suppresses the non-uniformity of the current flowing in the transistors.

When unequal numbers of body potential fixing portions 13 and sources 12 are provided around one drain 11, it is then desired that the body potential fixing portions 13 and the sources 12 are arranged in favorable symmetry with respect to a certain gate pad 153. In the layout shown in FIG. 32, the gate pad 153 shown by the character Q is surrounded by four sources 12 adjoining through the extensions 152a, and each of the four sources 12 faces to one body potential fixing portion 13 through an extension 152b. Further, each of the body potential fixing portions 13 faces to a pair of sources 12 through a pair of extensions 152a. In this way, in the example shown in FIG. 32, the layout displays favorable symmetry around the position shown as Q, which suppresses the non-uniformity of the current flowing in the transistors. Needless to say, the sources 12 and the body potential fixing portions 13 in FIG. 32 can be replaced with each other in the arrangement, which provides the same effects.

Figure 33:
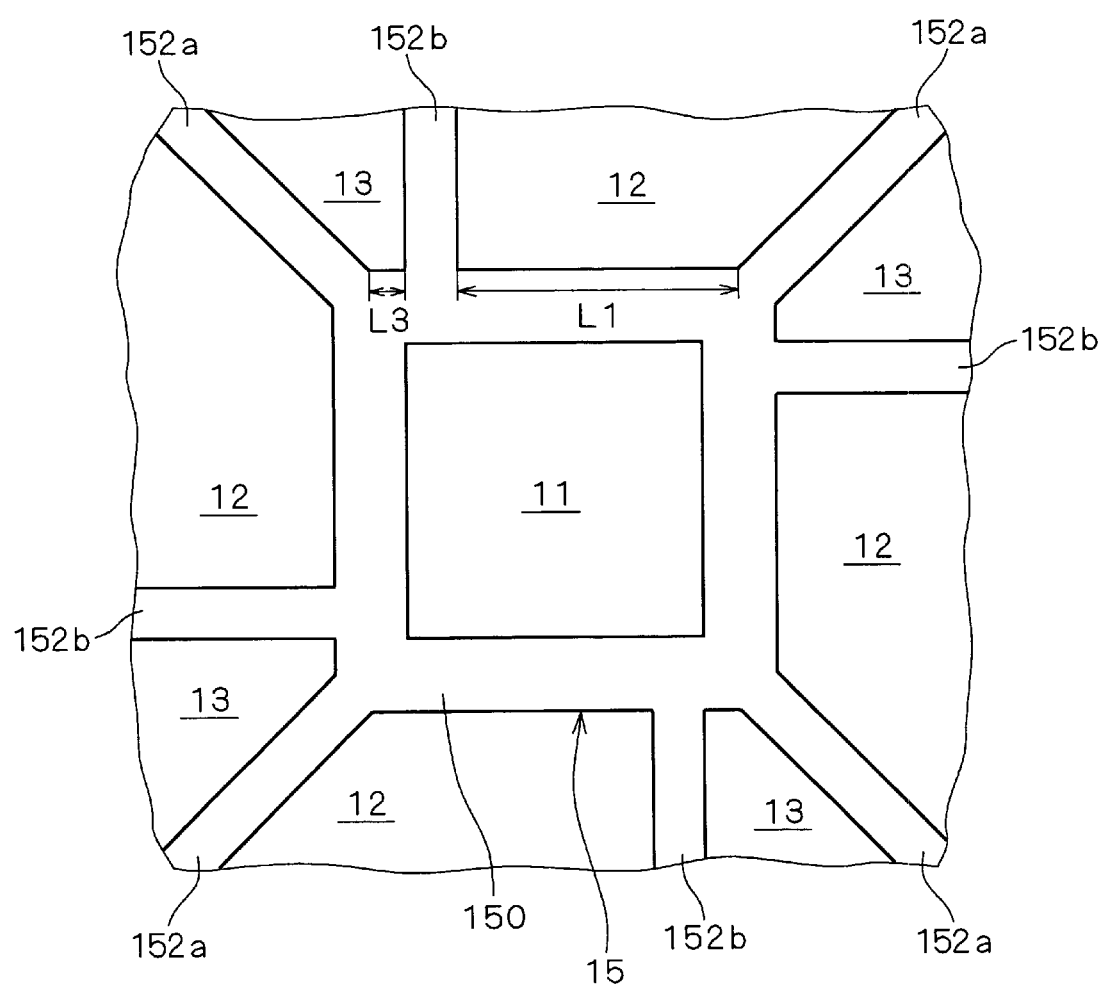
FIGS. 33 to 36 are plans showing structures according to a seventh preferred embodiment of the invention.
Figure 34:
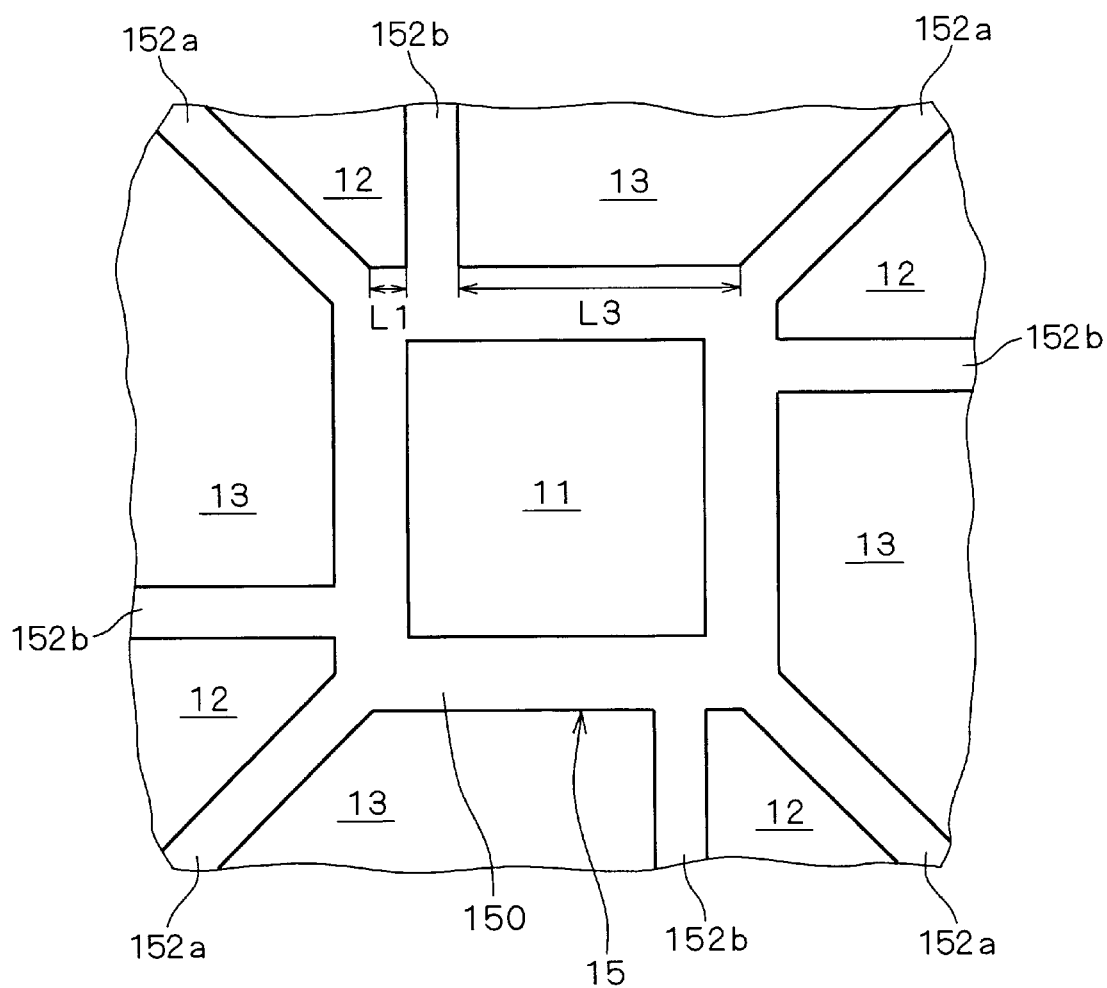
Figure 35:
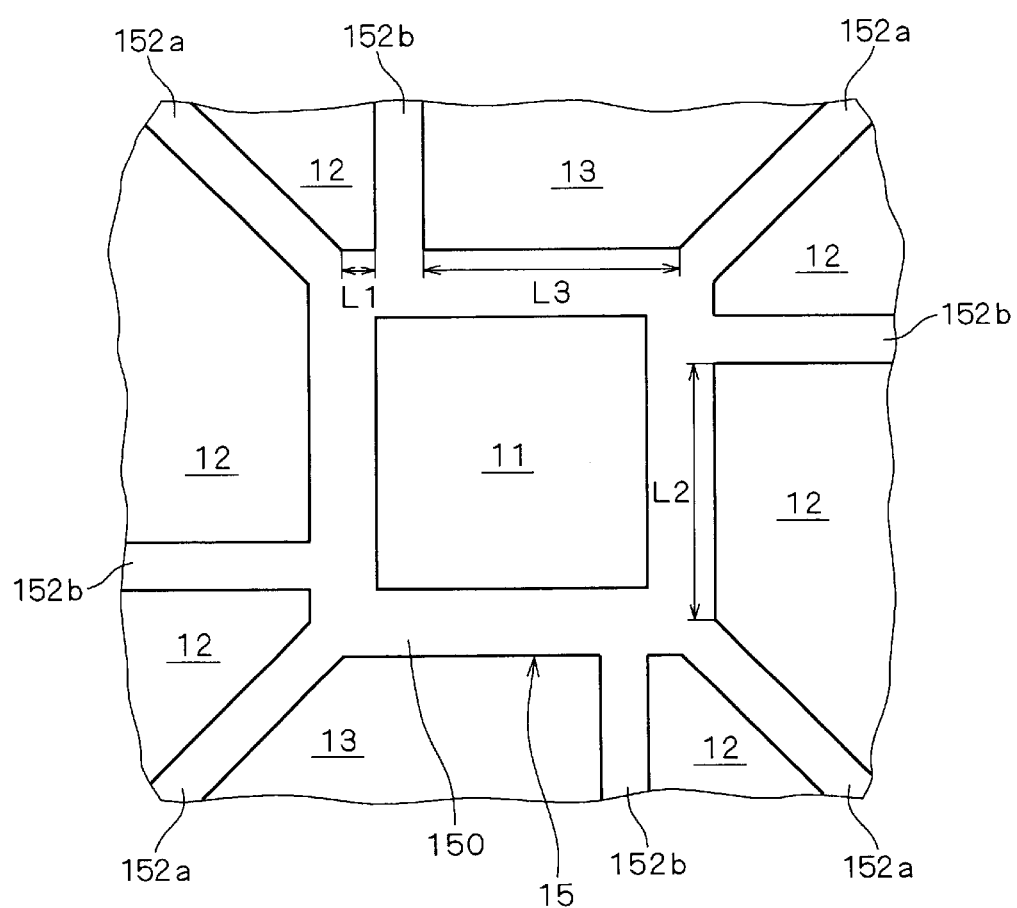

Seventh Preferred Embodiment:

FIGS. 33 to 35 are plans showing structures of SOIMISFETs according to a seventh preferred embodiment of the invention The gate structures 15 shown in FIGS. 33 and 34 can be obtained by modifying the gate structure 15 shown in FIG. 28 in the sixth preferred embodiment as follows. That is, the length L1 of the boundary between the source 12 and the closed-loop portion 150 largely differs from the length L3 of the boundary between the body potential fixing portion 13 and the closed-loop portion 150. The gate pads 151 are not shown in this diagram. In the patterns shown in FIGS. 33 and 34, four sources 12 and four body potential fixing portions 13 surround one drain 11.

In FIG. 33, the lengths are set as L1>L3. Then the channel width of the transistor formed by the source 12 and the drain 11 can be made larger, which provides the transistor with high current driving capability.

On the other hand, in FIG. 34, the lengths are set as L3>L1. Then the body potential fixing portion 13 can be in contact with the body 10a (see FIG. 10, for example) in larger area and the potential at the body 10a can be fixed more certainly.

The structure shown in FIG. 35 adopts the gate structures 15 shown in FIGS. 33 and 34; however six sources 12 and two body potential fixing portions 13 surround one drain 11. The lengths L1 and L2 of the boundaries between the sources 12 and the closed-loop portion 150 are set equal to or smaller than the length L3 of the boundary between the body potential fixing portion 13 and the closed-loop portion 150. This is an example in which L1<L2=L3.

The areas of the regions in which the sources 12 and the body potential fixing portions 13 face to the drain 11 can be more finely controlled by means of this setting than by means of setting of the ratio in number between the sources 12 and body potential fixing portions 13 surrounding one drain 11, which leads to more fine control of the current flowing in the components.

Figure 36:
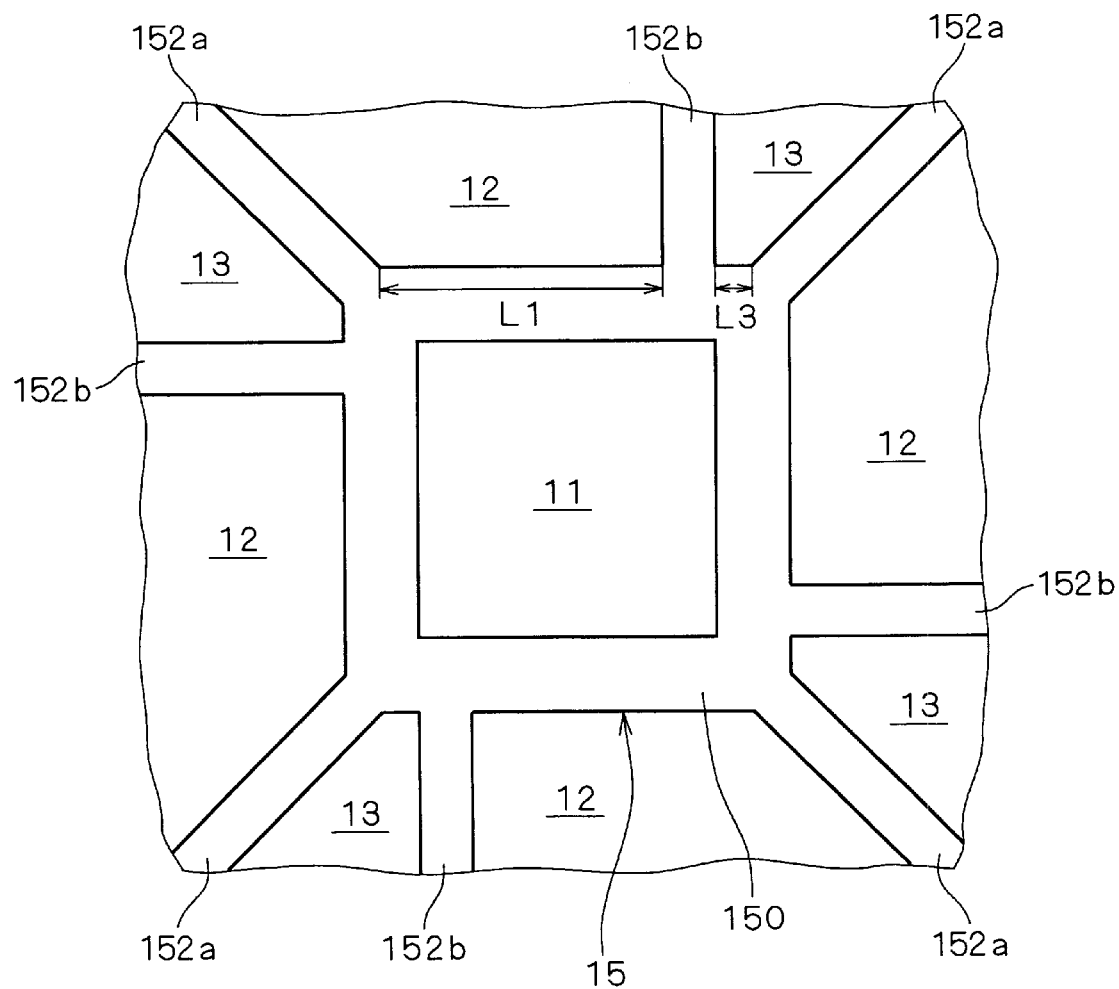
Figure 37:
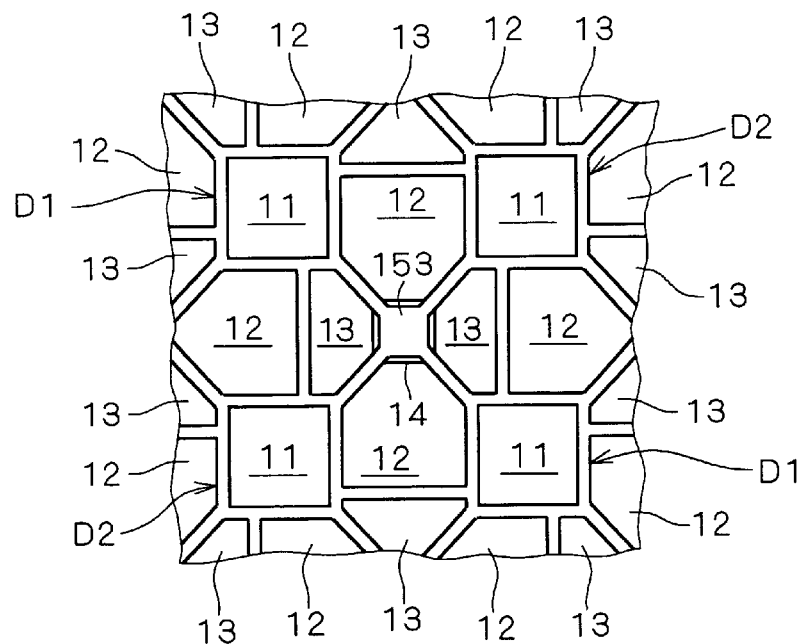
FIG. 37 is a plan showing a structure according to a modification of the seventh preferred embodiment of the invention.

FIG. 36 is a plan showing a pattern which is mirror-symmetrical to the pattern of FIG. 33. The pattern shown in FIG. 33 and the pattern shown in FIG. 36 can be easily arranged repeatedly in combination so as to form a plurality of transistors in an array as a modification of this preferred embodiment. FIG. 37 is a plan showing an example in which the combination of patterns is repeatedly arranged. This diagram shows an layout in which patterns D1 corresponding to FIG. 33 and patterns D2 corresponding to FIG. 36 are repeated in pairs.

Figure 38:
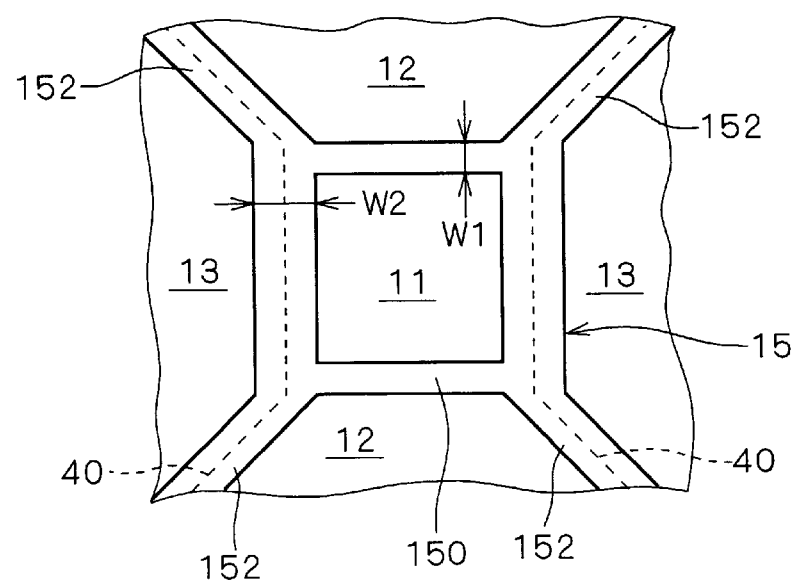
FIGS. 38 to 40 are plans showing structures according to an eighth preferred embodiment of the invention.
Figure 39:
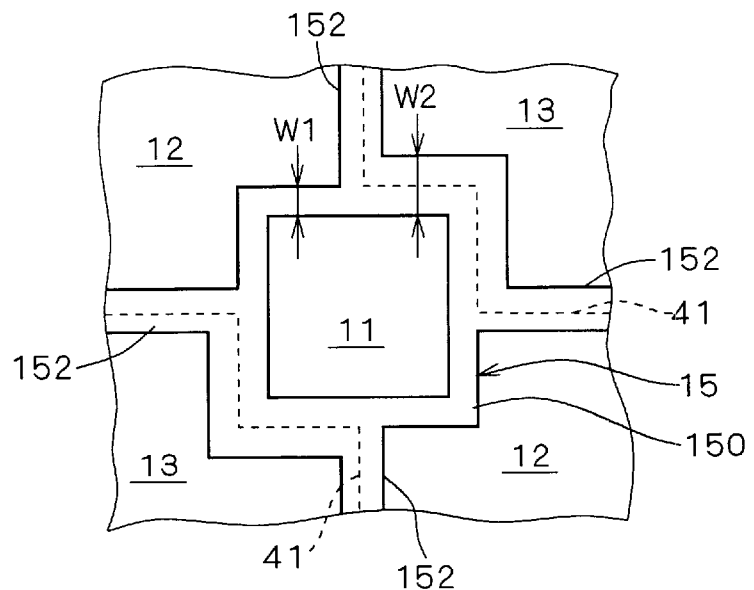
Figure 40:
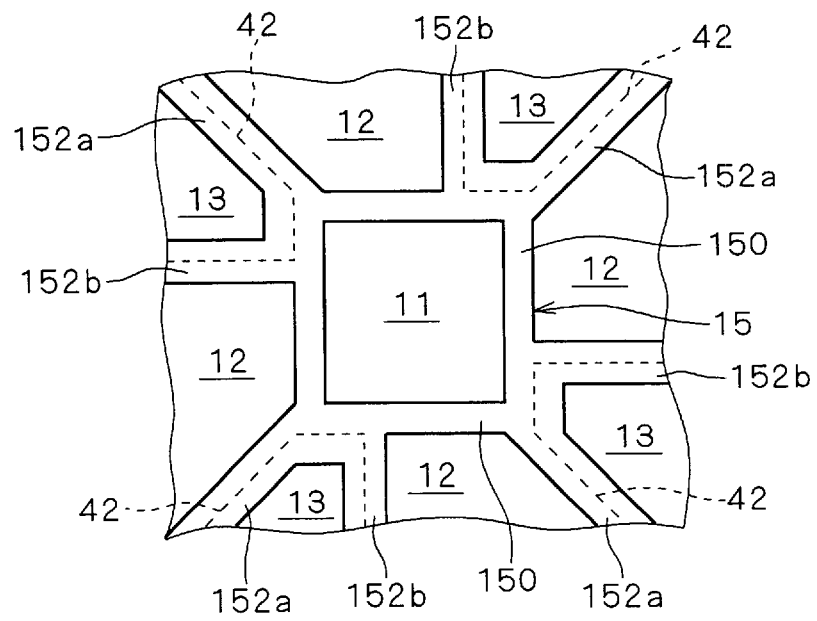
Figure 41:
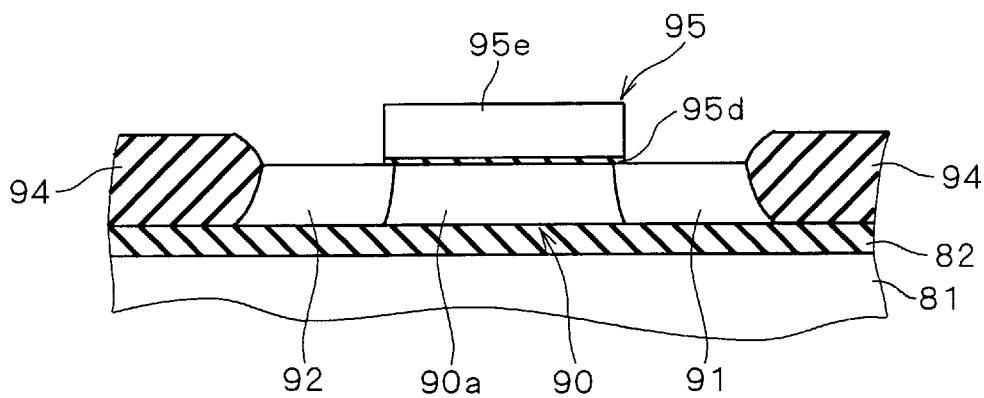
FIG. 41 is a sectional view showing a conventional technique.
Figure 42:
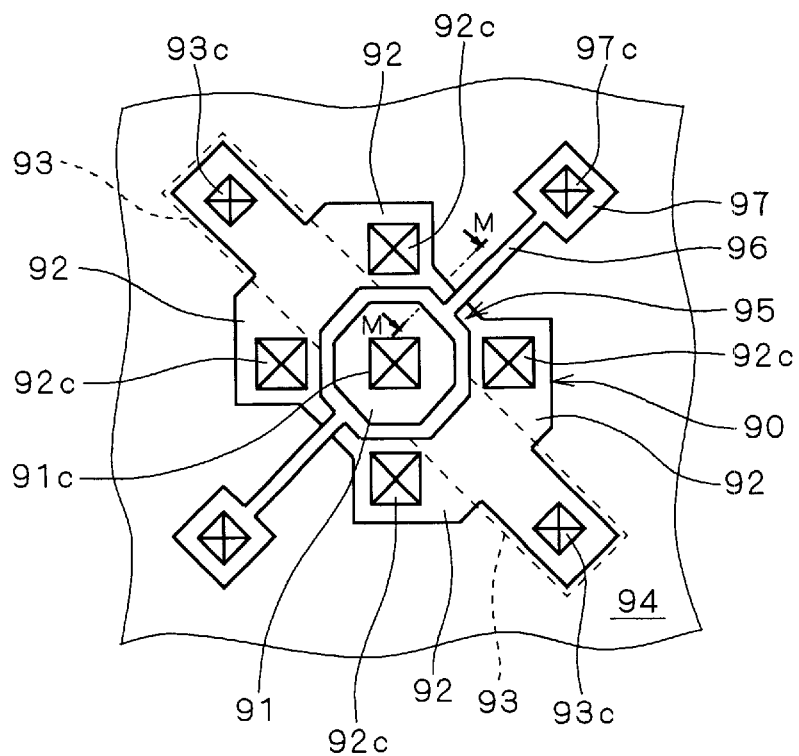
FIG. 42 is a plan showing a conventional technique.
Figure 43:
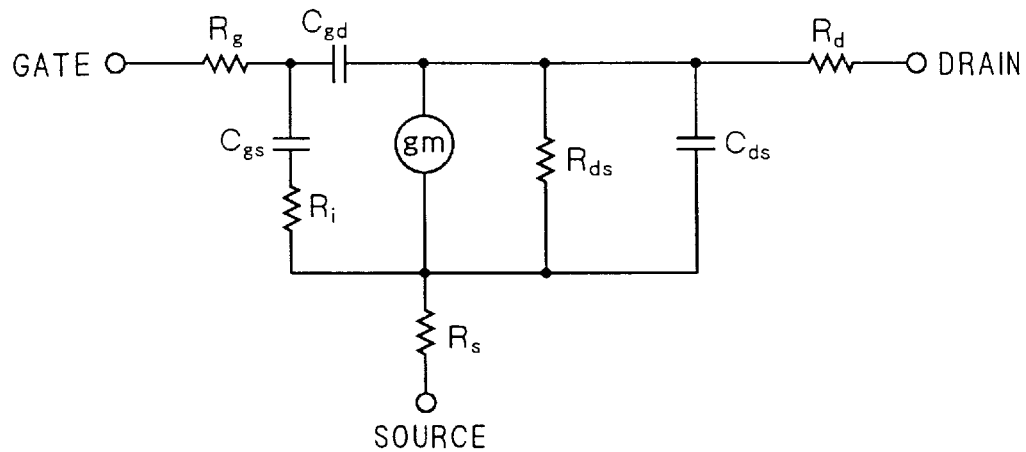
FIG. 43 is a circuit diagram showing a conventional technique.
Figure 44:
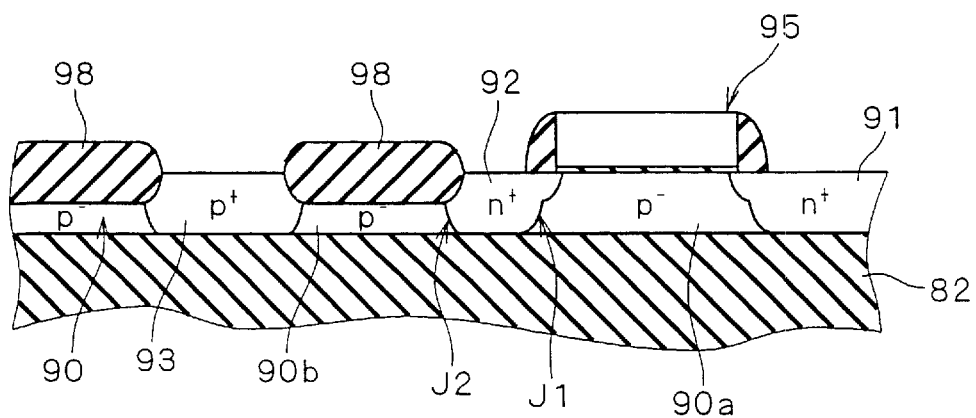
FIG. 44 is a sectional view showing a problem of the conventional technique.

Eighth Preferred Embodiment:

FIGS. 38 to 40 are plans showing structures of SOIMISFET according to an eighth preferred embodiment of the invention. The gate structures 15 shown in FIGS. 38, 39 and 40 can be obtained by respectively modifying the gate structures 15 shown in FIGS. 9, 20 and 36 as follows. That is to say, the width W2 of the closed-loop portion 150 in the position interposed between a body potential fixing portion 13 and the drain 11 is set larger than the width WI of the closed-loop portion 150 in the position interposed between a source 12 and the drain 11. In the patterns shown in FIGS. 38 to 40, one drain 11 is surrounded by the same numbers of sources 12 and body potential fixing portions 13. These diagrams do not show the gate pads 151, element isolation portions 14, and contacts 11c, 12c and 13c.

In these structures, it is possible to obtain transistors with high current driving capability since the channel length can be shortened in the transistors formed by the sources 12 and the drain 11. On the other hand, the spaces between the body potential fixing portions 13 and the drain 11 can be expanded, which means that the regions of different conductivity types can be spaced more widely. This ensures larger margin in the process of separately introducing impurities and thus enables favorable application of silicidation to the body potential fixing portions 13 and the drains 11.

The boundaries 40 to 42 in FIGS. 38 to 40 show the positions which define the implantations of ions of different conductivity types.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   an insulating layer having a main surface extending in a first direction and a second direction which intersect with each other;
   a semiconductor layer having a first conductivity type and having a first main surface and a second main surface which is in contact with said main surface of said insulating layer;
   at least one element isolation portion which is insulative and formed on said first main surface apart from said second main surface;
   at least one body potential fixing portion having said first conductivity type, formed at least on said first main surface of said semiconductor layer, and in contact with a first under semiconductor layer which is said semiconductor layer existing between said element isolation portion and said second main surface;
   at least one gate structure in which a gate insulating film is formed on said first main surface and a gate electrode is formed over said first main surface with said gate insulating film interposed therebetween, said at least one gate structure comprising a closed-loop portion which crosses a boundary between said element isolation portion and said first main surface and forms a closed loop on said element isolation portion and said first main surface, said closed loop being kept away from said body potential fixing portion;
   at least one first impurity region having a second conductivity type which is opposite to said first conductivity type, formed from said first main surface to said second main surface, and surrounded by said first under semiconductor layer and a second under semiconductor layer which is said semiconductor layer existing between said gate structure and said second main surface; and
   at least one second impurity region having said second conductivity type, facing to said first impurity region through said second under semiconductor layer, and separated from said body potential fixing portion by said first under semiconductor layer.

2. The semiconductor device according to claim 1, wherein said first and second impurity regions are a drain and a source, respectively.

3. The semiconductor device according to claim 2, wherein
   a plurality of said first impurity regions and/or a plurality of said second impurity regions are provided, and
   said first impurity region and said second impurity region are alternately arranged around one said element isolation portion.

4. The semiconductor device according to claim 3, wherein
   a plurality of said element isolation portions are provided,
   one said gate structure is provided over said plurality of said element isolation portions, and
   said gate structure has gate contact pads on said element isolation portions.

5. The semiconductor device according to claim 4, wherein
   a plurality of said body potential fixing portions are provided, one said body potential fixing portion is surrounded by one said element isolation portion, and
   said element isolation portions are arranged checkerwise and said one gate structure has said gate contact pads on two of said element isolation portions.

6. The semiconductor device according to claim 4, wherein
   a plurality of said gate structures are provided, and
   said element isolation portions are arranged in a matrix and said one gate structure has said gate contact pads on four of said element isolation portions.

7. The semiconductor device according to claim 6, wherein said body potential fixing portion is adjacent also to said second under semiconductor layer.

8. A semiconductor device comprising:
   an insulating layer having a main surface extending in a first direction and a second direction which intersect with each other;
   a semiconductor layer having a first conductivity type and having a first main surface and a second main surface which is in contact with said main surface of said insulating layer;
   at least one gate structure in which a gate insulating film is formed on said first main surface and a gate electrode is formed over said first main surface with said gate insulating film interposed therebetween, said at least one gate structure comprising a closed-loop portion forming a single closed loop and at least one extension having its one end coupled to said closed-loop portion;
   at least one first impurity region and at least one second impurity region both having a second conductivity type opposite to said first conductivity type and formed from said first main surface to said second main surface of said semiconductor layer, said first impurity region and said second impurity region being separated from each other by an under semiconductor layer which is said semiconductor layer existing between said closed-loop portion of said gate structure and said second main surface; and
   at least one body potential fixing portion having said first conductivity type and formed at least on said first main surface, said body potential fixing portion being separated from one said first impurity region by said under semiconductor layer and being separated from said second impurity region by an under region located between said extension of said gate structure and said second main surface.

9. The semiconductor device according to claim 8, wherein said first and second impurity regions are a drain and a source, respectively.

10. The semiconductor device according to claim 9, wherein
a plurality of said gate structures are provided, and
at least one said second impurity region is interposed between a pair of said body potential fixing portions.

11. The semiconductor device according to claim 9, wherein
a plurality of said gate structures are provided,
in each said gate structure, at least one said extension has a contact pad at its other end, and
said semiconductor device further comprises at least one element isolation portion which is insulative and provided on said first main surface and at least one of said contact pad of different ones of said gate structures are provided on said element isolation portion.

12. The semiconductor device according to claim 11, wherein said extensions are also provided on said element isolation portion.

13. The semiconductor device according to claim 11, wherein one said gate contact pad is provided on one said element isolation portion and shared by different ones of said gate structures.

14. The semiconductor device according to claim 13, wherein
said closed-loop portions are provided in a matrix,
a plurality of said element isolation portions are provided,
one said gate structure comprises a plurality of said extensions, and
said one element isolation portion is surrounded by a quadrilateral formed by two pairs of said gate structures,
and wherein, among said extensions of said two pairs of said closed-loop portions, said extensions which extend to said one element isolation portion are coupled with each other at said gate contact pad, and
four of said extensions of said two pairs of said closed-loop portions form the sides of said quadrilateral.

15. The semiconductor device according to claim 14, wherein
a plurality of said second impurity regions and a plurality of said body potential fixing portions are provided for said one gate structure, and
said second impurity regions and said body potential fixing portions are alternately arranged around one said first impurity region, with a plurality of said extensions interposed therebetween.

16. The semiconductor device according to claim 14, wherein
a plurality of said second impurity regions and a plurality of said body potential fixing portions are provided for said one gate structure,
said second impurity regions and said body potential fixing portions are arranged around one said first impurity region, with a plurality of said extensions interposed therebetween, and
said gate contact pad which is coupled with one of said extensions interposed between a pair of said second impurity regions or a pair of said body potential fixing portions is respectively surrounded by said second impurity regions or said body potential fixing portions.

17. The semiconductor device according to claim 9, wherein a boundary between said second impurity region and said closed-loop portion is longer than a boundary between said body potential fixing portion and said closed-loop portion.

18. The semiconductor device according to claim 9, wherein a boundary between said body potential fixing portion and said closed-loop portion is longer than a boundary between said second impurity region and said closed-loop portion.

19. The semiconductor device according to claim 9, wherein said closed-loop portion has a larger width in a position interposed between said body potential fixing portion and said first impurity region than in a position interposed between said first impurity region and said second impurity region.

* * * * *

UNITED STATES PATENT AND TRADEMARK OFFICE
CERTIFICATE OF CORRECTION

PATENT NO. : 6,355,957 B1
DATED : March 12, 2002
INVENTOR(S) : Maeda et al.

It is certified that error appears in the above-identified patent and that said Letters Patent is hereby corrected as shown below:

<u>Title page,</u>
Item [30], Foreign Application Priority information should read:
-- [30]      Foreign Application Priority Data
   Jan. 5, 2000   (JP) .................................. 2000-005242 --

Signed and Sealed this

Seventeenth Day of September, 2002

*Attest:*

JAMES E. ROGAN
*Attesting Officer*    *Director of the United States Patent and Trademark Office*